United States Patent
Hara et al.

(10) Patent No.: US 6,734,104 B2
(45) Date of Patent: May 11, 2004

(54) METHOD OF MANUFACTURING A SEMICONDUCTOR DEVICE AND A SEMICONDUCTOR DEVICE

(75) Inventors: Kazusato Hara, Ome (JP); Keisuke Funatsu, Hamura (JP); Toshinori Imai, Ome (JP); Junji Noguchi, Ome (JP); Naohumi Ohashi, Hanno (JP)

(73) Assignee: Renesas Technology Corporation, Tokyo (JP)

( * ) Notice: Subject to any disclaimer, the term of this patent is extended or adjusted under 35 U.S.C. 154(b) by 3 days.

(21) Appl. No.: 10/298,585

(22) Filed: Nov. 19, 2002

(65) Prior Publication Data

US 2003/0073317 A1 Apr. 17, 2003

Related U.S. Application Data

(63) Continuation of application No. 09/823,975, filed on Apr. 3, 2001, now Pat. No. 6,495,466.

(30) Foreign Application Priority Data

Apr. 25, 2000 (JP) .................................... 2000-123839

(51) Int. Cl.⁷ .............................................. H01L 21/00
(52) U.S. Cl. ...................... 438/692; 438/723; 438/740
(58) Field of Search ................... 216/38, 88; 438/692, 438/723, 740

(56) References Cited

U.S. PATENT DOCUMENTS

| | | | |
|---|---|---|---|
| 6,051,508 A | 4/2000 | Takase et al. |
| 6,066,569 A | 5/2000 | Tobben |
| 6,165,891 A | 12/2000 | Chooi et al. |
| 6,184,142 B1 | 2/2001 | Chung et al. |
| 6,261,963 B1 | 7/2001 | Zhao et al. |
| 6,403,459 B1 | 6/2002 | Ohashi |

FOREIGN PATENT DOCUMENTS

JP    H09 1997-139423    5/1997

*Primary Examiner*—William A. Powell
(74) *Attorney, Agent, or Firm*—Antonelli, Terry, Stout & Kraus, LLP

(57) ABSTRACT

Over a plug, a stopper insulating film made of an organic film is formed, followed by successive formation of an insulating film and a hard mask. In the presence of a patterned resist film, the hard mask is dry etched, whereby an interconnection groove pattern is transferred thereto. By ashing with oxygen plasma, the resist film is removed to form the interconnection-groove-pattern-transferred hard mask. At this time, the organic film constituting the stopper insulating film has been covered with the insulating film. Then, the insulating film, stopper insulating film and hard mask are removed to form the groove pattern of interconnection. Hydrogen annealing may be conducted after formation of the plug, or the stopper insulating film may be formed over the plug via an adhesion layer.

13 Claims, 44 Drawing Sheets

METHOD OF MANUFACTURING A SEMICONDUCTOR DEVICE AND A SEMICONDUCTOR DEVICE

CROSS-REFERENCE TO RELATED APPLICATIONS

The application is a Continuation Application of application Ser. No. 09/823,975, filed Apr. 3, 2001, now U.S. Pat. No. 6,495,466.

BACKGROUND OF THE INVENTION

The present invention relates to a technique for the manufacture of a semiconductor device, and, more particularly, to a multilevel interconnection structure which is fabricated using the so-called damascene method and a technique which is effective when applied to a semiconductor device having such a multilevel interconnection structure.

As semiconductor devices tend to have a higher performance and a more miniaturized structure, a multilevel metallization technique has become necessary for their fabrication. For forming metallization layers in a semiconductor integrated circuit device, there is a known process of forming, over an interlayer insulating film, a thin film of a refractory metal, such as an aluminum (Al) alloy or tungsten; forming there over a resist pattern having the same shape as that of the interconnection pattern by photolithography; and, then etching the thin film using this resist pattern as a mask, thereby forming interconnection patterns. However, this process using an aluminum allo or the like has the inherent problem that there is a marked increase in the wiring resistance owing to the miniaturization of interconnections, which increases the wiring delay, thereby lowering the performance of the semiconductor device. Particularly, in a high-performance logic LSI (Large Scale Integrated Circuit), it causes a serious problem which represents a performance inhibiting factor.

A method (so-called damascene method) of forming an interconnection pattern in a groove, which has been made in an interlayer insulating film, by embedding therein an interconnection metal having copper (Cu) as a main conductor and removing an unnecessary portion of the metal outside the groove by CMP (Chemical Mechanical Polishing) is therefore under investigation.

SUMMARY OF THE INVENTION

As an interlayer insulating film wherein a groove to be embedded with a copper interconnection is to be formed, a structure is proposed which has an etching stopper film and a TEOS oxide film stacked one after another in this order. The TEOS oxide film is formed by plasma CVD (Chemical Vapor Deposition) using a TEOS (Tetra Ethyl Ortho Silicate: Si $(OC_2H_5)$) gas and an ozone $(O_3)$ gas. As the etching stopper film, a silicon nitride film is usually employed, when the interlayer insulating film is made of a TEOS oxide film.

Since the dielectric constant of the silicon nitride film is as high as about 7, disposal of it in the interlayer insulating film, however, increases the dielectric constant of the whole interlayer insulating film. This problem causes a rise in the capacitance between interconnections, leading to deterioration in the acting speed of operation of the semiconductor device or an increase in the power consumption. A technique for incorporating a silicon nitride film in the interlayer insulating film is described, for example, in U.S. Pat. No. 6,051,508.

Employment of a material which has a relatively low dielectric constant of about 2 to 3 and a high etching selectivity relative to the TEOS oxide film has been investigated; and, an organic SOG (Spin On Glass) film which is relatively stable to heat and has high resistance to humidity is regarded as promising for use as a material constituting the interlayer insulating film.

As a result of an investigation of a method of multilevel metallization in an interlayer insulating film, which has an organic SOG film as an etching stopper film, by the damascene method, the present inventors have found that such method involves a problem as described below.

When a groove pattern is formed by successively processing the TEOS oxide film and organic SOG film, using with the patterned resist film as a mask, and then the resist film is removed by oxygen plasma, an —OH group is formed in the organic SOG film and it roughens the film quality. Formation of the —OH group is accompanied by an increase in the water content in the organic SOG film, and when heat is applied thereto, film shrinkage due to a dehydration condensation reaction occurs, resulting in the appearance of cracks in the organic SOG film.

An object of the present invention is to provide a technique which is capable of improving the reliability of the damascene interconnection.

Another object of the present invention is to provide a technique which is capable of reducing the capacitance between interconnections, thereby improving the performance of the semiconductor device.

The above-described objects, further objects and novel features of the present invention will be apparent from the description herein and the accompanied drawings.

Among the aspects and features disclosed in the present application, typical ones will next be summarized below:

(1) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; and (f) etching the first insulating film in the presence of the hard mask, thereby transferring the pattern of the hard mask to the first insulating film, wherein the first insulating film is an organic-functional-group-containing insulating film having a lower dielectric constant than a silicon oxide film and the second insulating film has a lower dielectric constant than a silicon nitride film.

(2) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; and (f) etching the first insulating film in the presence of the hard mask, thereby transferring the pattern of the hard mask to the first insulating film, wherein the first insulating film is an organic-functional-group-containing insulating film having a lower dielectric constant than a silicon oxide film; the second insulating film has a lower dielectric constant than a silicon nitride film; and the first insulating film, the second insulating film and the hard mask are deposited to have thicknesses of about 50 to 200 nm, about 200 to 2000 nm, and about 50 to 200 nm, respectively.

(3) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; and (f) etching the first insulating film in the presence of the hard mask, thereby transferring the pattern of the hard mask to the first insulating film, wherein the first insulating film is an organic-functional-group-containing insulating film having a lower dielectric constant than a silicon oxide film; the second insulating film has a lower dielectric constant than a silicon nitride film; and the first insulating film, the second insulating film and the hard mask are deposited to have thicknesses of about 200 to 3000 nm, about 100 to 500 nm, and about 50 to 200 nm, respectively.

(4) A method of manufacturing a semiconductor device comprises the steps of: (a) successively forming, over a base having a plug or interconnection formed thereon, an adhesion layer, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; and (f) etching the first insulating film and adhesion layer in the presence of the hard mask, thereby transferring the pattern of the hard mask to the first insulating film and adhesion layer, wherein the first insulating film is an organic-functional-group-containing insulating film having a lower dielectric constant than a silicon oxide film; the second insulating film has a lower dielectric constant than a silicon nitride film; and the adhesion layer is a silicon oxide film having a thickness not greater than 50 nm.

(5) A method of manufacturing a semiconductor device comprises the steps of: (a) after hydrogen annealing of a base having a plug or interconnection formed thereon, successively depositing over the base a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; and (f) etching the first insulating film in the presence of the hard mask, thereby transferring the pattern of the hard mask to the first insulating film, wherein the first insulating film is an organic-functional-group-containing insulating film having a lower dielectric constant than a silicon oxide film; and the second insulating film has a lower dielectric constant than a silicon nitride film.

(6) A method of manufacturing a semiconductor device comprises the steps of: (a) after hydrogen annealing of a base having a plug or interconnection formed thereon, successively depositing over the base an adhesion layer, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; and (f) etching the first insulating film and adhesion layer in the presence of the hard mask, thereby transferring the pattern of the hard mask to the first insulating film and adhesion layer, wherein the first insulating film is an organic-functional-group-containing insulating film having a lower dielectric constant than a silicon oxide film; the second insulating film has a lower dielectric constant than a silicon nitride film; and the adhesion layer is a silicon oxide film having a thickness not greater than 50 nm.

(7) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; and (f) etching the first insulating film in the presence of the hard mask, thereby transferring the pattern of the hard mask to the first insulating film, wherein the first insulating film is an organic-functional-group-containing insulating film having a lower dielectric constant than a silicon oxide film; the second insulating film has a lower dielectric constant than a silicon nitride film; and the hard mask is a metal film or a metal compound.

(8) A method of manufacturing a semiconductor device comprises the steps of: (a) successively forming, over a base having a plug or interconnection formed thereon, a first insulating film, a second insulating film having a lower etching resistance than the first insulating film, and a hard mask; (b) forming thereover a resist pattern; (c) etching the hard mask and the upper portion of the second insulating film in the presence of the resist pattern, thereby transferring the pattern of the resist pattern to the hard mask and the upper portion of the second insulating film; (d) removing the resist pattern; (e) etching the lower portion of the second insulating film in the presence of the hard mask, thereby selectively transferring the pattern of the hard mask to lower portion of the second insulating film; and (f) etching the first insulating film in the presence of the hard mask, thereby transferring the pattern of the hard mask to the first insulating film, wherein the first insulating film is an organic-functional-group-containing insulating film having a lower dielectric constant than a silicon oxide film; the second insulating film has a lower dielectric constant than a silicon nitride film; and the hard mask is a silicon nitride film.

(9) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; (f) etching the first insulating film in the presence of the hard mask, thereby transferring the pattern of the hard mask to the first insulating film; (g) successively depositing a barrier metal layer and a copper film over the whole surface of a substrate; and (h) removing the barrier metal layer and the copper film until the upper portion of the second insulating film is exposed; wherein the first insulating film is an organic-functional-group-containing insulating film having a lower dielectric constant than a silicon oxide film; and the second insulating film has a lower dielectric constant than a silicon nitride film.

(10) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; (f) etching the first insulating film in the presence of the hard mask, thereby transferring the pattern of the hard mask to the first insulating film; (g) successively depositing a barrier metal layer and a copper film over the whole surface of a substrate; and (h) removing the barrier metal layer and the copper film until the upper portion of the second insulating film is exposed; wherein the first insulating film is an organic-functional-group-containing insulating film having a lower dielectric constant than a silicon oxide film; the second insulating film has a lower dielectric constant than a silicon nitride film; and the first insulating film, the second insulating film and the hard mask are deposited to have thicknesses of about 50 to 200 nm, about 200 to 2000 nm, and about 50 to 200 nm, respectively.

(11) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; (f) etching the first insulating film in the presence of the hard mask, thereby transferring the pattern of the hard mask to the first insulating film; (g) successively depositing a barrier metal layer and a copper film over the whole surface of a substrate; and (h) removing the barrier metal layer and the copper film until the upper portion of the second insulating film is exposed; wherein the first insulating film is an organic-functional-group-containing insulating film having a lower dielectric constant than a silicon oxide film; the second insulating film has a lower dielectric constant than a silicon nitride film; and the first insulating film, the second insulating film and the hard mask are deposited to have thicknesses of about 200 to 3000 nm, about 100 to 500 nm, and about 50 to 200 nm, respectively.

(12) A method of manufacturing a semiconductor device comprises the steps of: (a) successively depositing, over a base having a plug or interconnection formed thereon, an adhesion layer, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; (f) etching the first insulating film and adhesion layer in the presence of the hard mask, thereby transferring the pattern of the hard mask to the first insulating film and adhesion layer; (g) successively depositing a barrier metal layer and a copper film over the whole surface of a substrate; and (h) removing the barrier metal layer and the copper film until the upper portion of the second insulating film is exposed; wherein the first insulating film is an organic-functional-group-containing insulating film having a lower dielectric constant than a silicon oxide film; the second insulating film has a lower dielectric constant than a silicon nitride film; and the adhesion layer is a silicon oxide film having a thickness not greater than 50 nm.

(13) A method of manufacturing a semiconductor device comprises the steps of: (a) after hydrogen annealing of a base having a plug or interconnection formed thereon, successively depositing over the base a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; (f) etching the first insulating film in the presence of the hard mask, thereby transferring the pattern of the hard mask to the first insulating film; (g) successively depositing a barrier metal layer and a copper film over the whole surface of a substrate; and (h) removing the barrier metal layer and the copper film until the upper portion of the second insulating film is exposed; wherein the first insulating film is an organic-functional-group-containing insulating film having a lower dielectric constant than a silicon oxide film; and the second insulating film has a lower dielectric constant than a silicon nitride film.

(14) A method of manufacturing a semiconductor device comprises the steps of: (a) after hydrogen annealing of a base having a plug or interconnection formed thereon, successively depositing over the ground an adhesion layer, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; (f) etching the first insulating film in the presence of the hard mask, thereby transferring the pattern of the hard mask to the first insulating film; (g) successively depositing a barrier metal layer and a copper film over the whole surface of a substrate; and (h) removing the barrier metal layer and the copper film until the upper portion of the second insulating film is exposed; wherein the first insulating film is an organic-functional-group-containing insulating film having a lower dielectric constant than a silicon oxide film; the second insulating film has a lower dielectric constant than a silicon nitride film; and the adhesion layer is a silicon oxide film having a thickness not greater than 50 nm.

(15) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask in the presence of the resist pattern, thereby transferring the pattern of the resist pattern to the hard mask; (d) removing the resist pattern; (e) etching the second insulating film in the presence of the hard mask, thereby selectively transferring the pattern of the hard mask to the second insulating film; (f) etching the first insulating film in the presence of the hard mask, thereby transferring the pattern of the hard mask to the first insulating film; (g) successively depositing a barrier metal layer and a copper film over the whole surface of a substrate; and (h) removing the barrier metal layer and the copper film until the upper portion of the second insulating film is exposed; wherein the first insulating film is an organic-functional-group-containing insulating film having a lower dielectric constant than a silicon oxide film; the second insulating film has a lower dielectric constant than a silicon nitride film; and the hard mask is a metal film or metal compound.

(16) A method of manufacturing a semiconductor device comprises the steps of: (a) successively depositing, over a base having a plug or interconnection formed thereon, a first insulating film, a second insulating film having a lower etching resistance than the first insulating film, and a hard mask; (b) forming thereover a resist pattern; (c) etching the hard mask and the upper portion of the second insulating film in the presence of the resist pattern, thereby transferring the pattern of the resist pattern to the hard mask and the upper portion of the second insulating film; (d) removing the resist pattern; (e) etching the lower portion of the second insulating film in the presence of the hard mask, thereby selectively transferring the pattern of the hard mask to the lower portion of the second insulating film; (f) etching the first insulating film in the presence of the hard mask, thereby transferring the pattern of the hard mask to the first insulating film; (g) successively depositing a barrier metal layer and a copper film over the whole surface of a substrate; and (h) removing the barrier metal layer and the copper film until the upper portion of the second insulating film is exposed; wherein the first insulating film is an organic-functional-group-containing insulating film having a lower dielectric constant than a silicon oxide film; the second insulating film has a lower dielectric constant than a silicon nitride film; and the hard mask is a silicon nitride film.

According to the above-described methods, the first insulating film is protected by the second insulating film upon removal of the resist pattern, which is to be used for transfer of the pattern to the hard mask, by oxygen plasma so that even if the first insulating film is made of an organic insulating film having a low resistance against oxygen plasma, the first insulating film is free from the influence of oxygen plasma, and a deterioration in the film quality of the first insulating film can be suppressed. In addition, since the first insulating film itself is etched using a hard mask, it is not exposed to oxygen plasma.

By the use of the first insulating film made of an organic insulating film having a lower dielectric constant than a silicon oxide film as an etching stopper for the second insulating film having a lower dielectric constant than a silicon nitride film, it becomes possible to constitute the insulating film, which surrounds the plug or interconnection, from an insulating film having a lower dielectric constant than a silicon nitride film and an organic insulating film having a lower dielectric constant than a silicon oxide film, thereby suppressing an increase in the capacitance between interconnections.

Moreover, by increasing the etching selectivity to the hard mask relative to the first insulating film, it becomes possible to thicken the first insulating film having a lower dielectric constant than a silicon oxide film, thereby bringing about high effects for suppressing an increase in the capacitance between interconnections.

Furthermore, delamination of the first insulating film formed over the plug or interconnection can be prevented by subjecting the base-constituting plug or interconnection to hydrogen annealing treatment, thereby positively causing degassing from the gap of the plug or interconnection. By disposing an adhesion layer on the plug or interconnection, delamination of the first insulating film due to the influence of degassing can also be prevented even if degassing from the gap of the plug or interconnection occurs upon formation of the first or second insulating film.

DETAILED DESCRIPTION OF THE EMBODIMENTS

Figure 1:
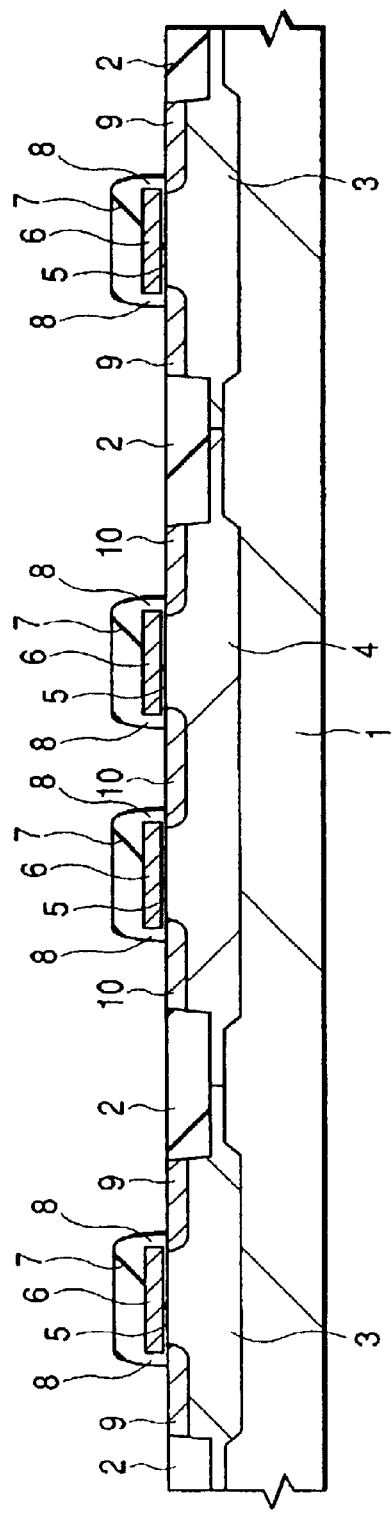
FIG. 1 is a fragmentary cross-sectional view of a semiconductor substrate illustrating, in the order of the steps, one example of the manufacturing method of a semiconductor device according to first embodiment (Embodiment 1) of the present invention.

The present invention will be described in detail based on the accompanying drawings. In all of the drawings which illustrate various embodiments, like elements of structure will be identified with like reference numerals and overlapping descriptions will be omitted.

(Embodiment 1)

FIGS. 1 to 19 are cross-sectional views each illustrating, in the order of steps, one example of the method of manufacture of a semiconductor device according to Embodiment 1. A description will hereinafter be made in the order of the steps of the method based on the drawings.

As illustrated in FIG. 1, a semiconductor substrate made of p-type single crystal silicon is prepared and an element isolating region 2 is formed on the main surface of the semiconductor substrate 1. This element isolating region 2 is formed, for example, in the following manner. First, a silicon oxide film ($SiO_2$) and a silicon nitride film ($Si3N4$) are formed successively over the main surface of the semiconductor substrate 1. The silicon nitride film is etched using a patterned photoresist film. Using this etched silicon nitride film as a mask, a shallow groove is formed in the semiconductor substrate 1. An insulating film, for example, a silicon oxide film, is deposited to embed the shallow groove therewith. The silicon oxide film outside the shallow groove is removed by CMP, followed by removal of the silicon nitride film by wet etching, whereby the element isolating region 2 is formed.

For example, using the patterned photoresist film as a mask, impurities are ion-implanted to form a p-type well 3 and n-type well 4. In the p-type well 3, p-conductivity type impurities, such as boron (B), are ion-implanted, while n-conductivity type impurities, such as phosphorus (P), are ion-implanted to the n-type well. Impurities may thereafter be ion-implanted to each well region in order to control the threshold value of the MISFET (Metal Insulator Semiconductor Field Effect Transistor).

For example, a silicon oxide film serving as a gate insulating film 5, a polycrystalline silicon film serving as a gate electrode 6 and a silicon oxide film serving as a cap insulating film 7 are successively deposited to form a laminate film, followed by etching of the laminate film using a photoresist film, which has been patterned by photolithography, as a mask. Thus, the gate insulating film 5, gate electrode 6 and cap insulating film 7 are formed. This gate insulating film 5 can be formed, for example, by thermal CVD or thermal oxidation. This gate electrode 6 can be formed, for example, by CVD. In order to reduce the resistance of the gate electrode 6, n-type or p-type impurities may be doped according to the channel type of MISFET. More specifically, n-type impurities and p-type impurities may be doped to the gate electrodes of the n channel MISFET and the p channel MISFET, respectively. For doping, ion implantation can be adopted. Over the gate electrode 6, a refractory metal silicide film, such as tungsten silicide ($WSi_x$), molybdenum silicide ($MoSi_x$) titanium silicide ($TiSi_x$) or tantalum silicide ($TaSi_x$), may be stacked, or a metal layer, such as tungsten, may be formed via a barrier metal layer, such as titanium nitride (TiN) or tungsten nitride (WN). This makes it possible to reduce the sheet resistance of the gate electrode 6, thereby improving the speed of operation of the MISFET. The cap insulating film 7 can be deposited, for example, by CVD.

After deposition of a silicon oxide film as an insulating film over the semiconductor substrate 1, for example, by CVD, this silicon oxide film is subjected to anisotropic etching, whereby side wall spacers 8 are formed on the side walls of the gate electrode 6. Using a photoresist film as a mask, n-type impurities (ex. phosphorus or arsenic (As)) are ion-implanted to the p-type well 3 to form n-type semiconductor regions 9 on both sides of the gate electrode 6 on the p-type well 3. The n-type semiconductor regions 9 are formed in self alignment with the gate electrode 6 and side wall spacers 8. The n-type semiconductor regions 9 function as source and drain regions of the n-channel MISFET. Similarly, using a photoresist film as a mask, p-type impurities (ex. boron) are ion-implanted to the n-type well 4 to form p-type semiconductor regions 10 on both sides of the gate electrode 6 over the n-type well 4. The p-type semiconductor regions 10 are formed in self alignment with the gate electrode 6 and side wall spacers 8 and they function as source and drain regions of the p-channel MISFET.

It is also possible to form a so-called LDD (Lightly Doped Drain) structure by forming a semiconductor region containing impurities at a low concentration prior to the formation of the side wall spacers 8 and to form a semiconductor region containing impurities at a high concentration after the formation of the side wall spacers 8.

Figure 2:
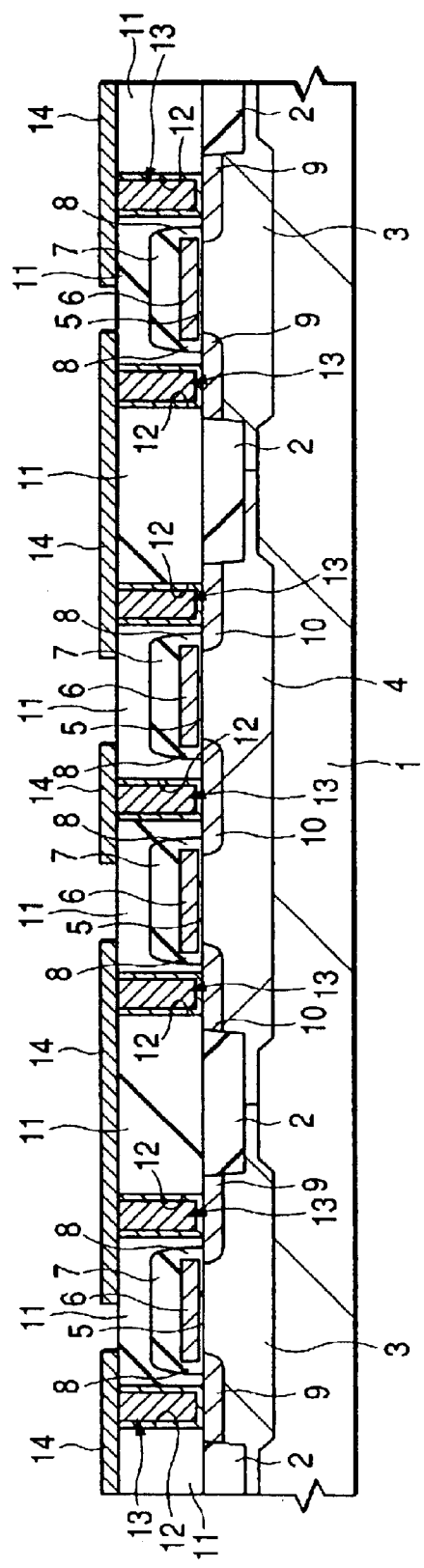
FIG. 2 is a fragmentary cross-sectional view of a semiconductor substrate for illustrating, in the order of the steps, one example of the manufacturing method of a semiconductor device according to Embodiment 1 of the present invention.

As illustrated in FIG. 2, after deposition of a silicon oxide film as an insulating film over the semiconductor substrate 1, for example, by CVD or sputtering, the silicon oxide film is polished, for example, by CMP, whereby a first interlayer insulating film 11 having a planarized surface is formed. This first interlayer insulating film 11 may be formed by stacking a silicon nitride film, SOG film, BPSG (Boron Phosphor Silicate Glass) film and PSG (Phosphor Silicate Glass) film one after another.

Then, a connecting hole 12 is formed in the first interlayer insulating film 11 by photolithography. This connecting hole 12 is formed on the necessary portion of the n-type semiconductor region 9 or p-type semiconductor region 10.

A plug 13 is then formed in the connecting hole 12, for example, in the following manner. First, as a conductive film, for example, a titanium nitride film is formed over the whole surface of the semiconductor substrate 1, including the inside of the connecting hole 12. This titanium nitride film can be formed, for example, by CVD. Since CVD is excellent in step coverage, the titanium nitride film can be formed inside of the minute connecting hole 12 with a uniform film thickness. A conductive film to embed the connecting hole 12 therewith, for example, a tungsten film, is then formed. This tungsten film can be formed, for example, by CVD. Employment of CVD also makes it possible to embed the minute connecting hole 12 with tungsten. The tungsten film and titanium nitride film in a region outside the connecting hole 12 are removed, for example, by CMP to form the plug 13. Prior to the formation of the titanium nitride film, a titanium (Ti) film or the like may be deposited, followed by heat treatment for conversion, into silicide, of the semiconductor substrate (n-type or p-type semiconductor regions 9, 10) at the bottom of the connecting hole 12. Formation of such a silicide layer makes it possible to reduce the contact resistance at the bottom of the connecting hole 12.

As a conductive film, a tungsten film or the like is then formed all over the surface of the semiconductor substrate 1. This tungsten film is patterned, for example, by photolithography to form an interconnection 14 of a first metallization layer. The tungsten film can be formed, for example, by CVD or sputtering.

Figure 3:
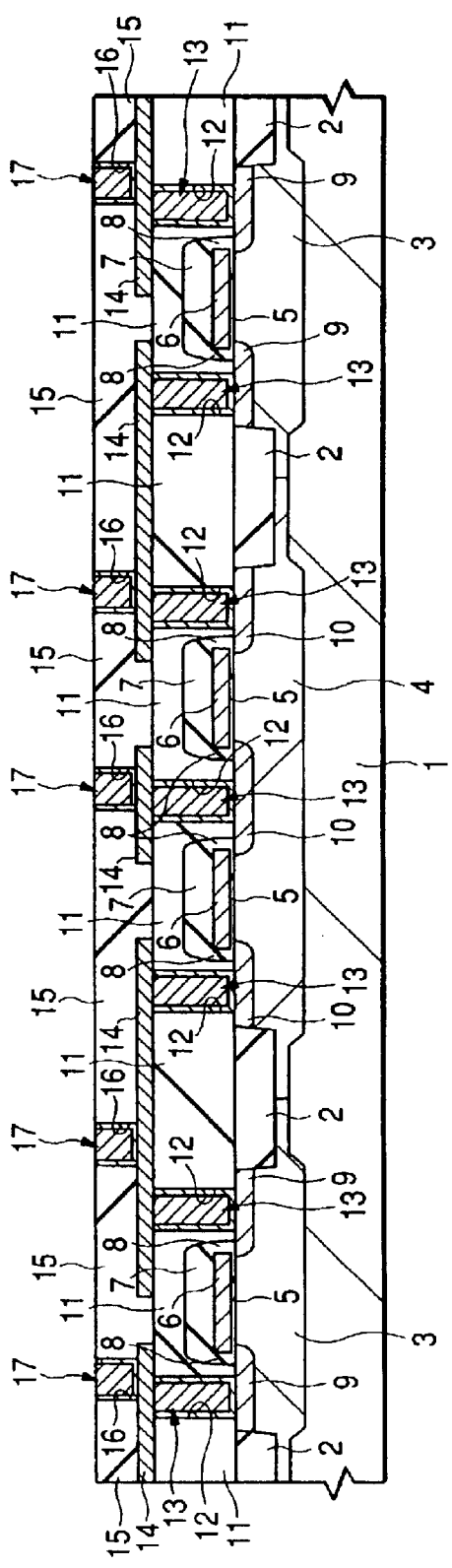
FIG. 3 is a fragmentary cross-sectional view of a semiconductor substrate for illustrating, in the order of the steps, one example of the manufacturing method of a semiconductor device according to Embodiment 1 of the present invention.

As illustrated in FIG. 3, an insulating film covering the interconnection 14, for example, a silicon oxide film, is formed. This insulating film is planarized by CMP to form a second interlayer insulating film 15.

A photoresist film having an opening in a region wherein a connecting hole is to be formed is formed, for example, over the second interlayer insulating film 15, and this insulating film is etched using the photoresist film as a mask, whereby the connecting hole 16, which is a groove, is formed in a predetermined region of the second interlayer insulating film 15.

In the connecting hole 16, a plug 17 made of, for example, a conductive film is then formed. This plug 17 can be formed in the following manner. All over the surface of the semiconductor substrate 1 including the inside of the connecting hole 16, a barrier metal layer is formed, followed by the formation of a conductive film, for example, a tungsten film to embed the connecting hole 16 therewith. The tungsten film and barrier metal layer are removed from a region outside the connecting hole 16 by CMP to form the plug 17.

The barrier metal layer has a function of preventing diffusion of tungsten around the second interlayer insulating film 15, and titanium nitride, for example, can be used as the barrier metal layer. Not only a titanium nitride film, but also another metal film having a function of preventing diffusion of tungsten may be employed. Instead of titanium nitride, for example, tantalum (Ta) or tantalum nitride (TaN) can be employed. In the description of the subsequent steps, reference will be made to a titanium nitride film as the barrier metal layer of the plug 17, but a tantalum or tantalum nitride film can be used as a substitute.

The tungsten film serves as a main conductive layer of the plug 17 and can be formed for example by CVD or sputtering.

A method of forming the second to fifth metallization layers according to the present invention will be described next.

First, a method of forming the second metallization layer will be described in the order of steps based on FIGS. 4 to 13.

Figure 4:
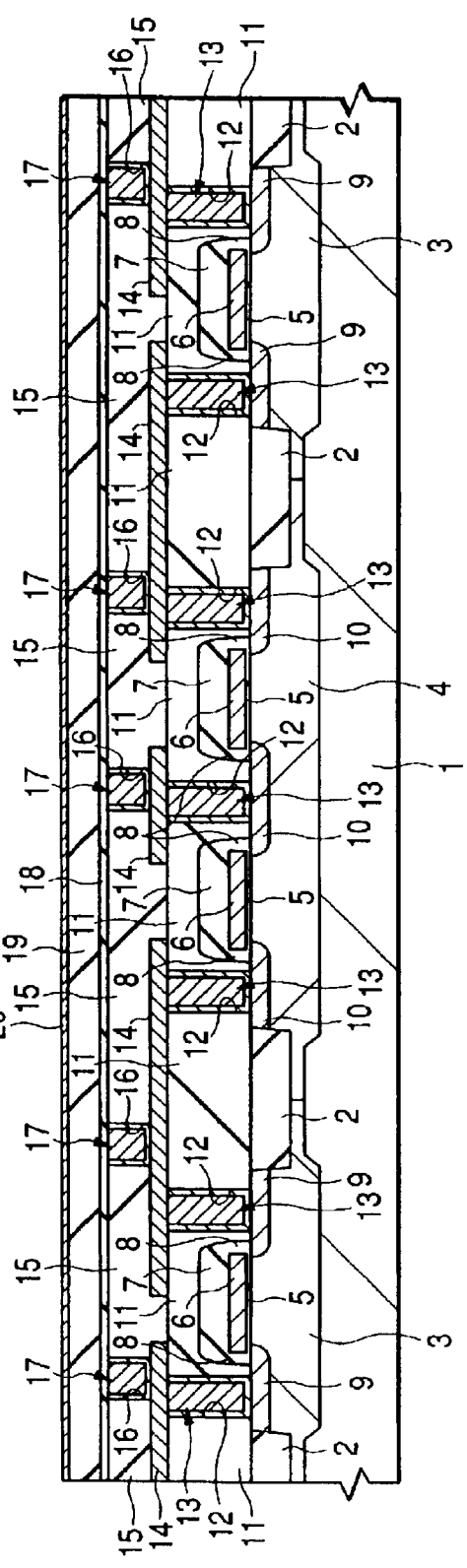
FIG. 4 is a fragmentary cross-sectional view of a semiconductor substrate for illustrating, in the order of the steps, one example of the manufacturing method of a semiconductor device according to Embodiment 1 of the present invention.

As illustrated in FIG. 4, after formation (deposition) of a stopper insulating film over the second interlayer insulating film 15 and plug 17, an insulating film 19 and a hard mask 20 for the formation of the second metallization layer are formed (deposited) successively.

The stopper insulating film 18 is made of, for example, an organic SOG film, and its thickness is about 50 to 200 nm. As the stopper insulating film 18, an organic SOG film may be used, for example, but instead of it, an organic-functional-group-containing insulating film having high etching selectivity relative to the insulating film 19 and a lower dielectric constant (for example, about 2 to 3) than a silicon oxide film can be used.

The insulating film 19 is made of, for example, a TEOS oxide film and its thickness is about 200 to 2000 nm. As the insulating film, a TEOS oxide film may be used, for example, but instead of it, an inorganic or organic insulating film, such as an inorganic SOG film or a fluorine-containing silicon oxide film (SiOF), having a lower dielectric constant than a silicon nitride film and high resistance to oxygen plasma can be used. The stopper insulating film 18 is formed to be thinner than the insulating film 19.

The hard mask 20 is formed of, for example, a metal film, such as a tungsten (W) film or an aluminum (Al) film, or a metal compound film, such as a titanium nitride (TiN) film or a tantalum nitride (TaN) film, and its thickness is about 50 to 200 nm. For the hard mask 20, a metal film or metal compound film providing high resistance to oxygen plasma and high etching selectivity relative to the underlying insulating film 19 is selected.

The organic SOG film constituting the stopper insulating film 18 can be formed, for example, by an application method. This method makes it possible to planarize the surface of the stopper insulating film 18 without using a planarizing technique, such as etch back or CMP, thereby facilitating the formation of multilevel metallization layers. As will be described later, the stopper insulating film 18 functions as an etching stopper upon formation of an interconnection groove in the insulating film 19. More specifically, the insulating film 19 is etched under the conditions not permitting easy etching of the organic SOG film compared with the insulating film 1. The organic SOG film has a thickness selected to satisfy the function of it as an etching stopper upon formation of the interconnection groove. The above-described film thickness of 50 to 200 nm is determined in consideration of such conditions. As a method of forming the organic SOG film, an application method is exemplified, but another method, such as CVD, may be used as well.

The TEOS oxide film constituting the insulating film 19 is formed by plasma CVD using TEOS gas and $O_3$ gas as raw material gases. Use of plasma CVD contributes to a reduction in the film forming temperature. The metallization step is conducted in the latter stage of the fabrication process (so-called former process) of a semiconductor device so that the TEOS oxide film is desirably treated at a temperature (for example, as low as about 400□ C.) not influencing the device structure (impurity diffusion layer, silicide layer, etc.) already fabricated. Plasma CVD is advantageous as a film formation method satisfying the desire for temperature reduction. In addition, when TEOS is used for the formation of a silicon oxide film, cluster fluidity upon film formation can be heightened, thereby making it possible to obtain a silicon oxide film having excellent step coverage.

In the stopper insulating film 18 and insulating film 19, an interconnection groove is formed wherein the second metallization layer is to be embedded, as will be described later.

The total thickness of the stopper insulating film 18 and insulating film 19 is determined by a designed film thickness necessary for the second metallization layer. It is desirable to set the stopper insulating film 18 so as to be thick when a reduction in the capacitance between interconnections is considered. This will be described in detail in Embodiment 4, and so a description thereof is omitted here.

The hard mask 20 functions, as will be described later, as a mask upon formation of the interconnection groove in the insulating film 19. The insulating film 19 is etched under conditions which prevent easy etching of the hard mask 20 relative to the insulating film 19. This hard mask 20 can be removed, as will be described later, upon metallization. The thickness of the hard mask 20 is therefore selected to satisfy the requirement for an etching stopper upon formation of the interconnection groove. The above-described thickness of 50 to 200 nm is determined in consideration of such conditions.

Figure 5:
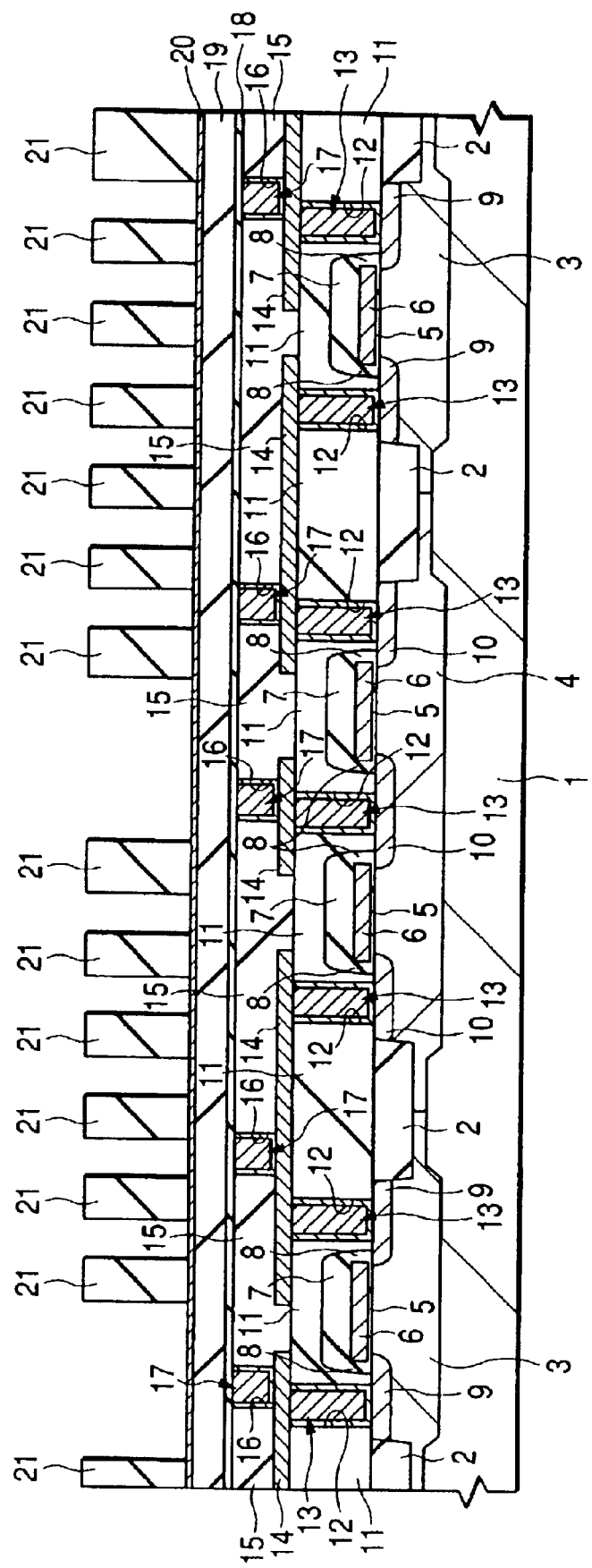
FIG. 5 is a fragmentary cross-sectional view of a semiconductor substrate for illustrating, in the order of the steps, one example of the manufacturing method of a semiconductor device according to Embodiment 1 of the present invention.

As illustrated in FIG. 5, a resist film 21 is formed over the hard mask 20, for example, by photolithography. The resist film 21 is patterned into an interconnection groove pattern so that an opening can be formed in a region wherein an interconnection groove is to be formed according to the interconnection pattern.

Figure 6:
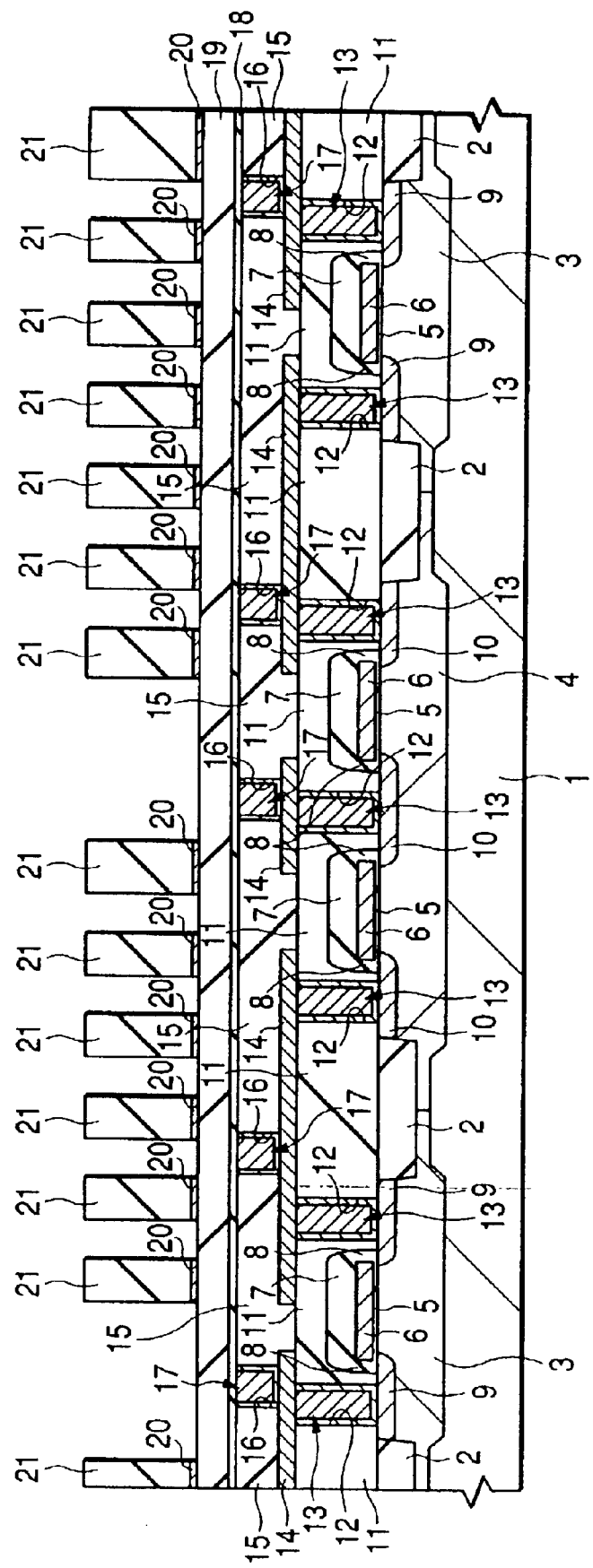
FIG. 6 is a fragmentary cross-sectional view of a semiconductor substrate for illustrating, in the order of the steps, one example of the manufacturing method of a semiconductor device according to Embodiment 1 of the present invention.
Figure 7:
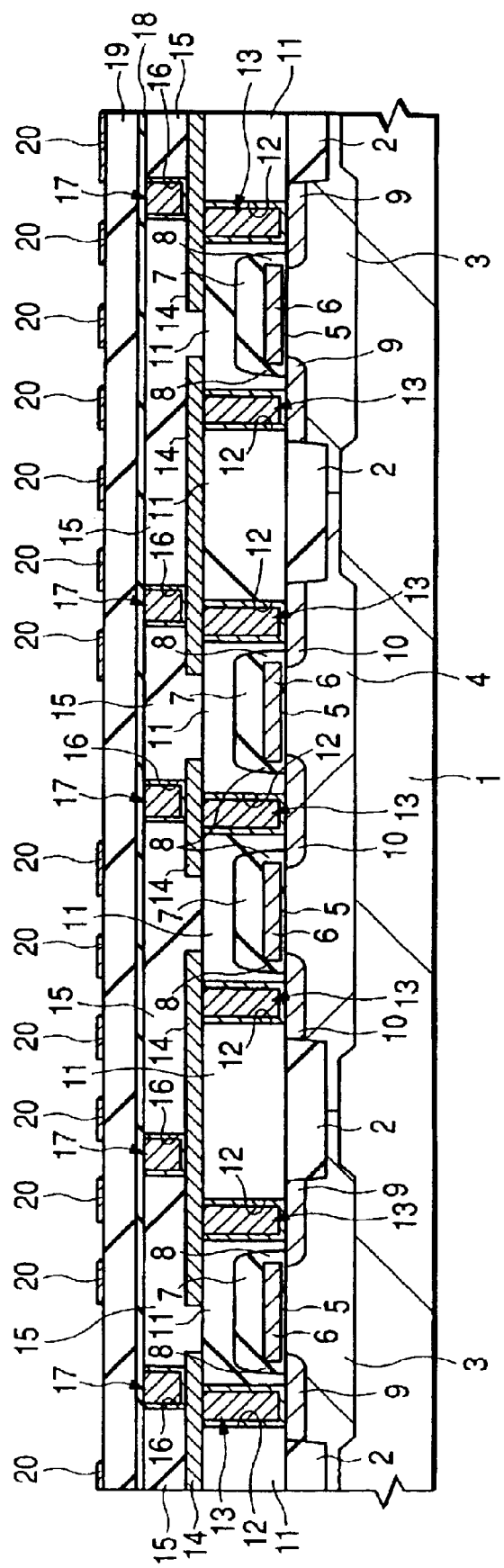
FIG. 7 is a fragmentary cross-sectional view of a semiconductor substrate for illustrating, in the order of the steps, one example of the manufacturing method of a semiconductor device according to Embodiment 1 of the present invention.

As illustrated in FIG. 6, the interconnection groove pattern is transferred to the hard mask 20 by dry etching thereof in the presence of the resist film 21. The resist film 21 is then removed, as illustrated in FIG. 7, by ashing with oxygen plasma. In this manner, the hard mask 20 having the interconnection groove pattern transferred thereto is formed. At this time, the organic SOG film constituting the stopper insulating film 18 is covered with the insulating film 19 having a high resistance to oxygen plasma so that it is free from exposure to oxygen plasma. A deterioration in the organic SOG film due to oxygen plasma can thus be prevented.

Figure 8:
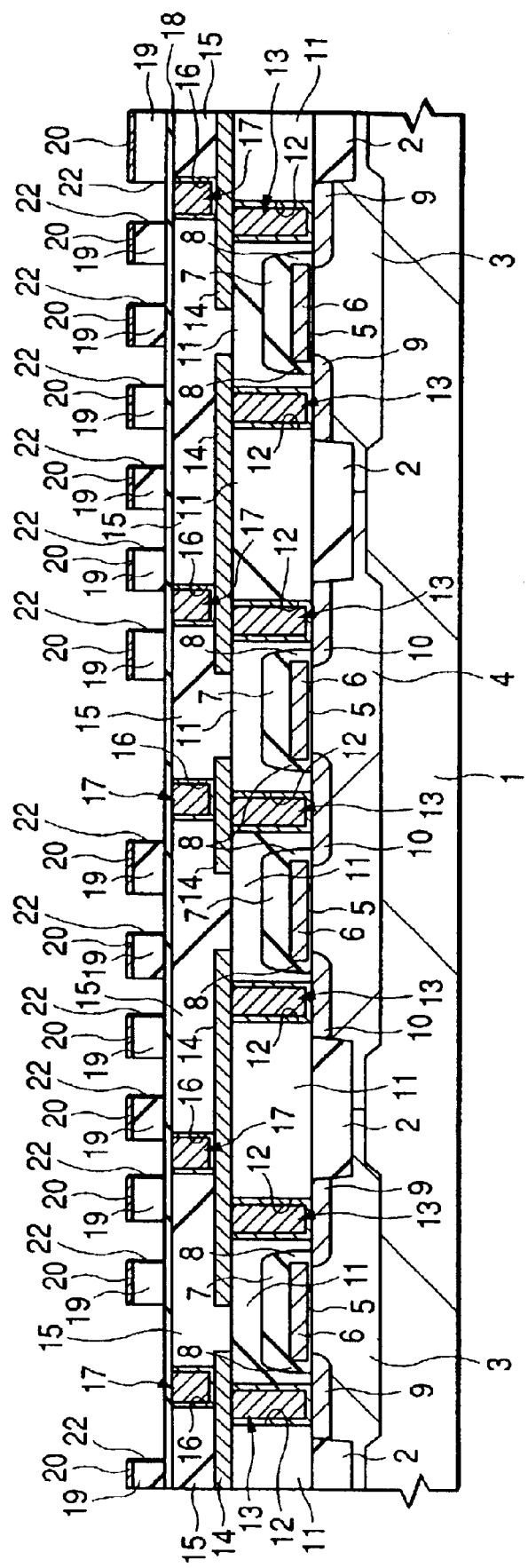
FIG. 8 is a fragmentary cross-sectional view of a semiconductor substrate for illustrating, in the order of the steps, one example of the manufacturing method of a semiconductor device according to Embodiment 1 of the present invention.

As illustrated in FIG. 8, first etching is conducted using the patterned hard mask 20 as a mask and using the stopper insulating film 18 as an etching stopper. By this first etching, a portion of the interconnection groove 22, which is a groove, is formed in the insulating film 19. This etching is conducted under specific conditions permitting easy etching of the insulating film 19 (TEOS oxide film) and not permitting easy etching of the hard mask 20 and stopper insulating film 18 (organic SOG film). As an etching gas, for example, a gas mixture of $CHF_4$, $CF_4$ and Ar is used.

Using the patterned hard mask 20 as a mask, a second etching is conducted. By this second etching, an exposed portion of the stopper insulating film 18 is removed and another portion of the interconnection groove 22 is formed in the stopper insulating film 18. This etching can be carried out by either one of the following two methods.

Figure 9:
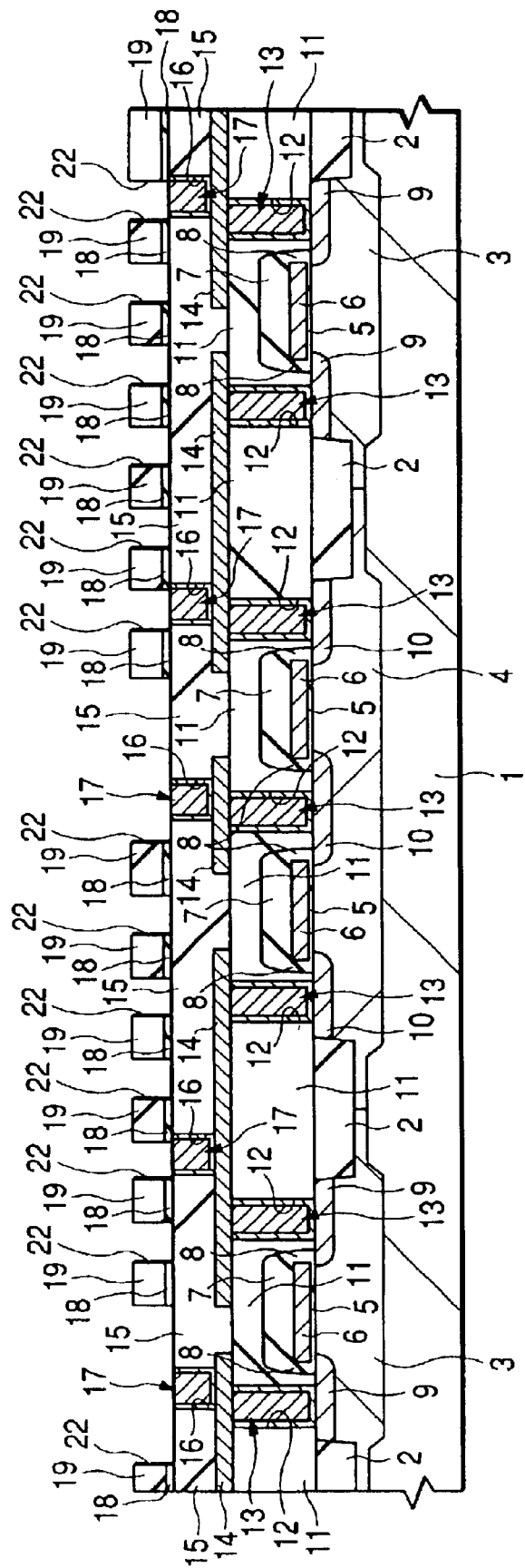
FIG. 9 is a fragmentary cross-sectional view of a semiconductor substrate for illustrating, in the order of the steps, one example of the manufacturing method of a semiconductor device according to Embodiment 1 of the present invention.

In a first method, etching conditions are selected wherein the etching selectivity to the hard mask 20 is low relative to the stopper insulating film 18 (organic SOG film). In this method, the hard mask 20 and stopper insulating film 18 are etched at a substantially similar etching rate. If such conditions are selected, the hard mask 20 almost disappears upon completion of the processing of the stopper insulating film 18 and the upper surface of the insulating film 19 is exposed, as illustrated in FIG. 9. For example, the hard mask 20 is etched away by making use of over-etching of the stopper insulating film 18.

Figure 10:
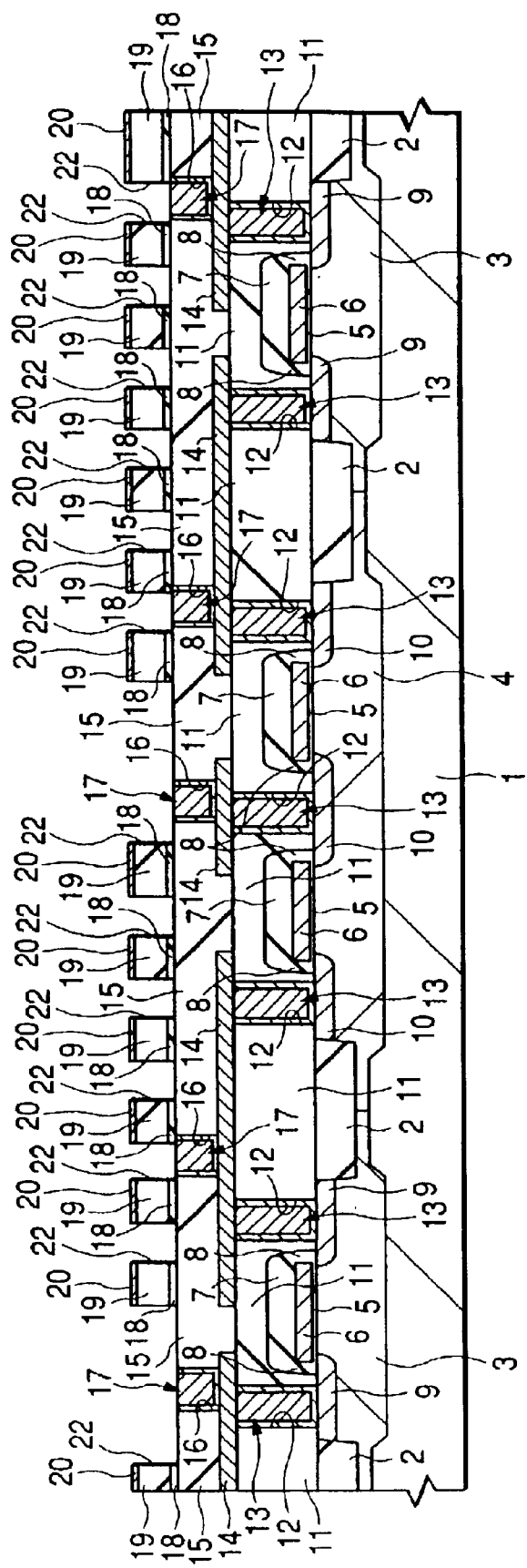
FIG. 10 is a fragmentary cross-sectional view of a semiconductor substrate for illustrating, in the order of the steps, one example of the manufacturing method of a semiconductor device according to Embodiment 1 of the present invention.

In the second method, etching conditions are selected wherein the etching selectivity to the hard mask 20 is high relative to the stopper insulating film 18 (organic SOG film). In this method, selective etching is effected under conditions permitting etching of the stopper insulating film 18, but not permitting easy etching of the hard mask 20. When such conditions are selected, a portion of the hard mask 20 still remains and the upper portion of the insulating film 19 is not exposed upon completion of the processing of the stopper insulating film 18, as illustrated in FIG. 10.

In either one of the first or second method, a gas mixture of $CHF_3$ and $O_2$ is used as an etching gas, but depending on the etching conditions, such as pressure, flow rate of the gas mixture, RF input power and substrate temperature, the first or second method can be selected.

An interconnection 23 of the second metallization layer is then formed inside of the interconnection groove 22. The interconnection 23 has a barrier metal layer and a main conductive layer and is formed as described below.

Figure 11:
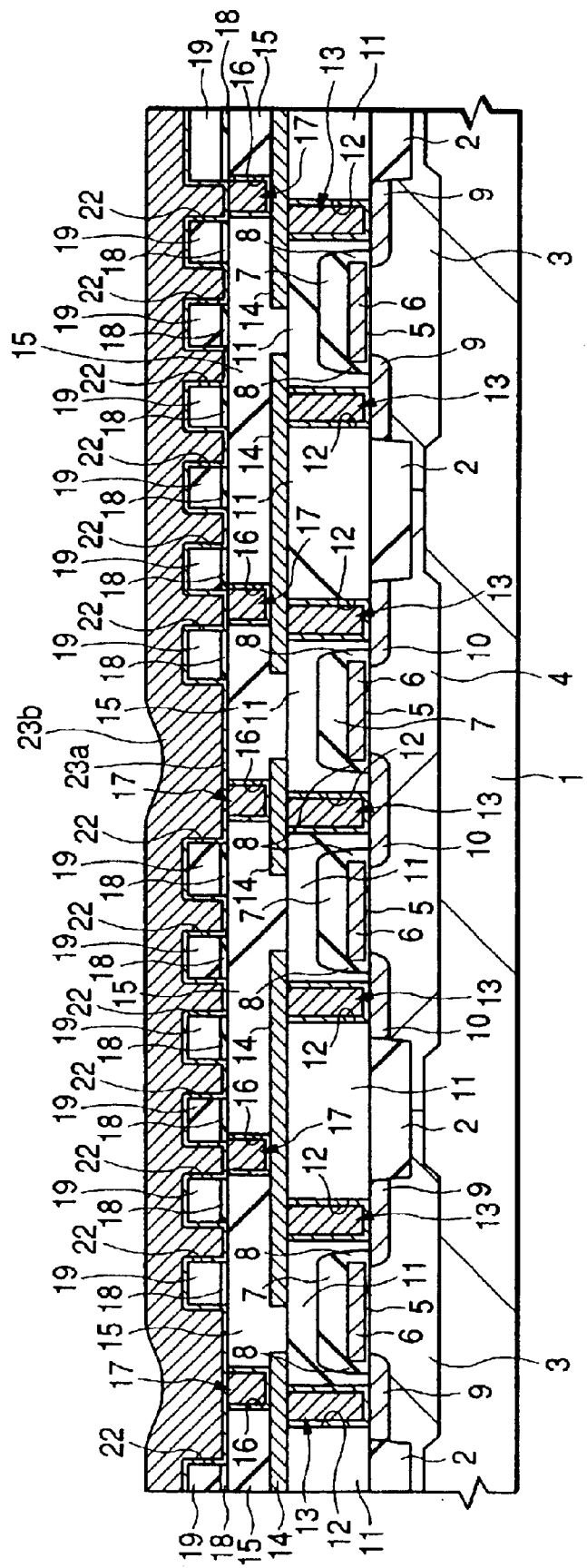
FIG. 11 is a fragmentary cross-sectional view of a semiconductor substrate for illustrating, in the order of the steps, one example of the manufacturing method of a semiconductor device according to Embodiment 1 of the present invention.
Figure 12:
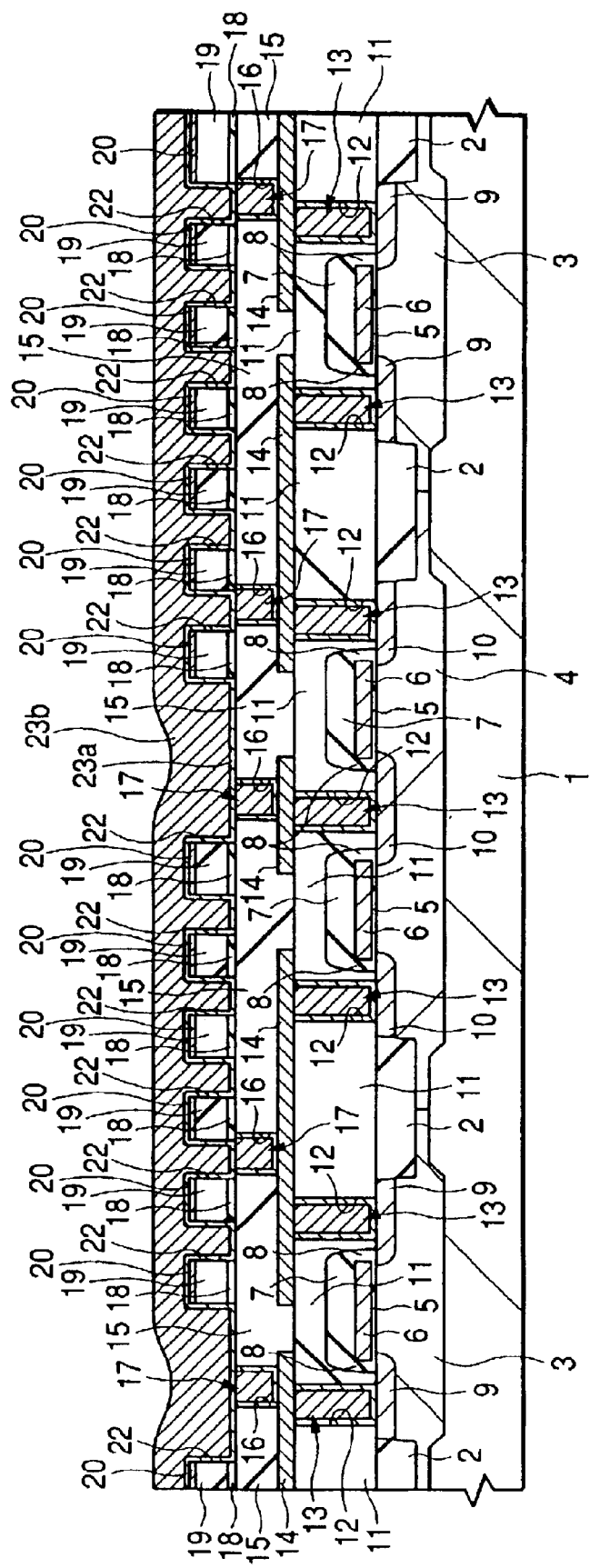
FIG. 12 is a fragmentary cross-sectional view of a semiconductor substrate for illustrating, in the order of the steps, one example of the manufacturing method of a semiconductor device according to Embodiment 1 of the present invention.

As illustrated in FIGS. 11 and 12, the barrier metal layer 23a is formed. FIG. 11 illustrates the barrier metal layer 23a formed in the interconnection groove 22 made by the first method, which was described above based on FIG. 9, while FIG. 12 illustrates the barrier metal layer 23a formed in the interconnection groove 22 made by the second method, which was described above based on FIG. 10.

The barrier metal layer 23a has functions of preventing diffusion of copper, which is a main component of the interconnection, and improving adhesion between copper and a silicon oxide film. As the barrier metal layer 23a, for example, a titanium nitride (TiN) film is usable. Instead of titanium nitride (TiN), tantalum nitride (TaN) or tantalum (Ta) may be used. Metal compound films or metal films can be used as the barrier metal film 23a insofar as they can prevent diffusion of copper. This barrier metal film 23 can be formed, for example, by CVD or sputtering. A description of the barrier metal layer in an interconnection of subsequent steps make reference to use of a titanium nitride (TiN) film as an example, but a tantalum nitride (TaN) film or tantalum (Ta) film can be used instead.

Over the barrier metal layer 23a, a seed layer (not illustrated) is formed. This seed layer serves as a seed for the formation of a copper plated layer, which will be described later, and it is made of copper. The seed layer is formed, for example, by CVD or sputtering. Then, the copper plated layer 23b is formed. Either one of electroplating or electroless plating can be adopted. The thickness of the plated layer is set at about 300 nm over the flat surface of the substrate.

In Embodiment 1, the copper film (plated layer 23b) is formed by plating, but sputtering may be adopted instead. In this case, the seed layer is not necessary. When the copper film is formed by sputtering, copper is caused to reflow by heat treatment so as to embed it in the interconnection groove 22. With regard to a copper film, which is a main conductive film of the interconnection in the subsequent steps, that formed by plating is exemplified, but that formed by sputtering may be used.

Figure 13:
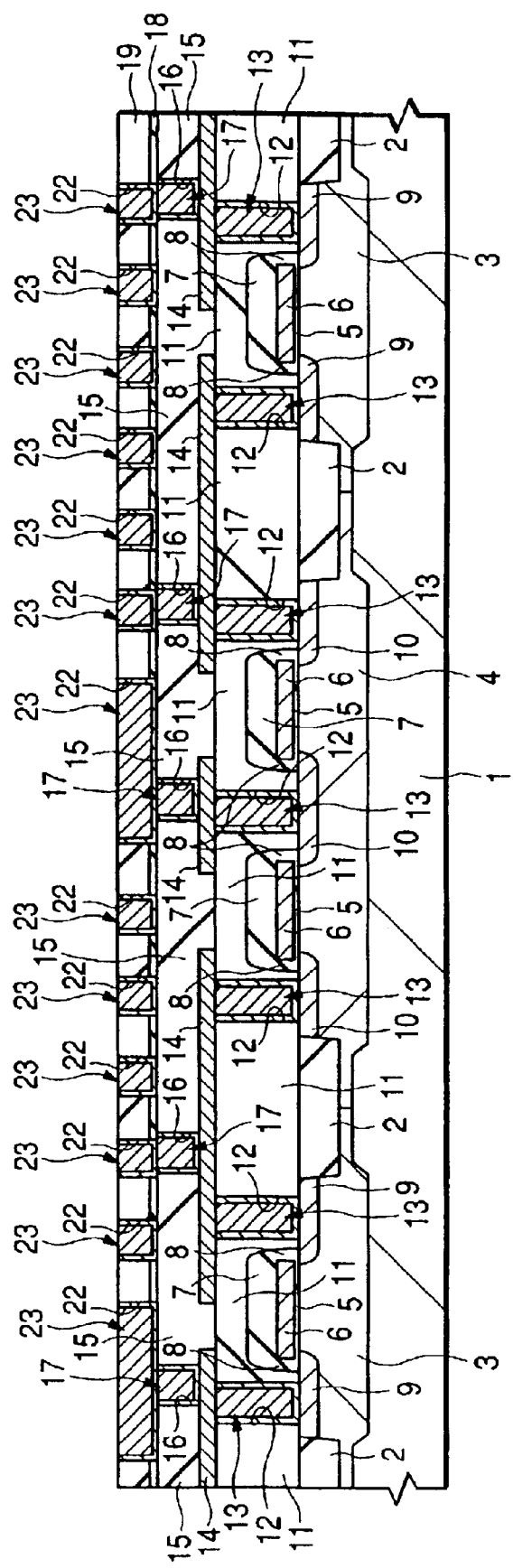
FIG. 13 is a fragmentary cross-sectional view of a semiconductor substrate for illustrating, in the order of the steps, one example of the manufacturing method of a semiconductor device according to Embodiment 1 of the present invention.

As illustrated in FIG. 13, the plating layer 23b and seed layer are polished by CMP. The copper portion is removed first because its polishing rate is larger. Polishing is continued further to remove the barrier metal layer 23a over the insulating film 19. The barrier metal layer 23a and copper film (plated layer 23 and seed layer) outside the interconnection groove 23 are thus removed.

When the stopper insulating film 18 is removed by the first method, as illustrated above in FIG. 9, removal by CMP is continued until the completion of the removal of the barrier metal layer 23a over the insulating film 19, because the upper surface of the insulating film 19 is in contact with the barrier metal layer 23a. When the stopper insulating film 18 is removed by the second method, as illustrated above in FIG. 10, on the other hand, removal by CMP is continued until the removal of both the barrier metal layer 23a over the insulating film 19 and the hard mask 20 is completed, because the hard mask 20 remains on the upper surface of the insulating film 19.

For polishing by CMP, a polishing slurry containing an oxidizing agent, such as hydrogen peroxide and having an alumina abrasive dispersed in the slurry, can be used. Alternatively, the copper film and barrier metal layer are polished simultaneously by the same platen. After polishing by CMP, the abrasive slurry and copper which has adhered to the surface of the substrate can be removed by two-stage brush scrub cleaning with a 0.5% aqueous ammonia solution and pure ammonia.

In this manner, the interconnection 23 of the second metallization layer is completed. Then, the desired number of metallization layers are laid thereover by a similar method to that employed for the second metallization layer.

Next, the method of formation of the third to fifth metallization layers will be described based on FIGS. 14 to 19.

Figure 14:
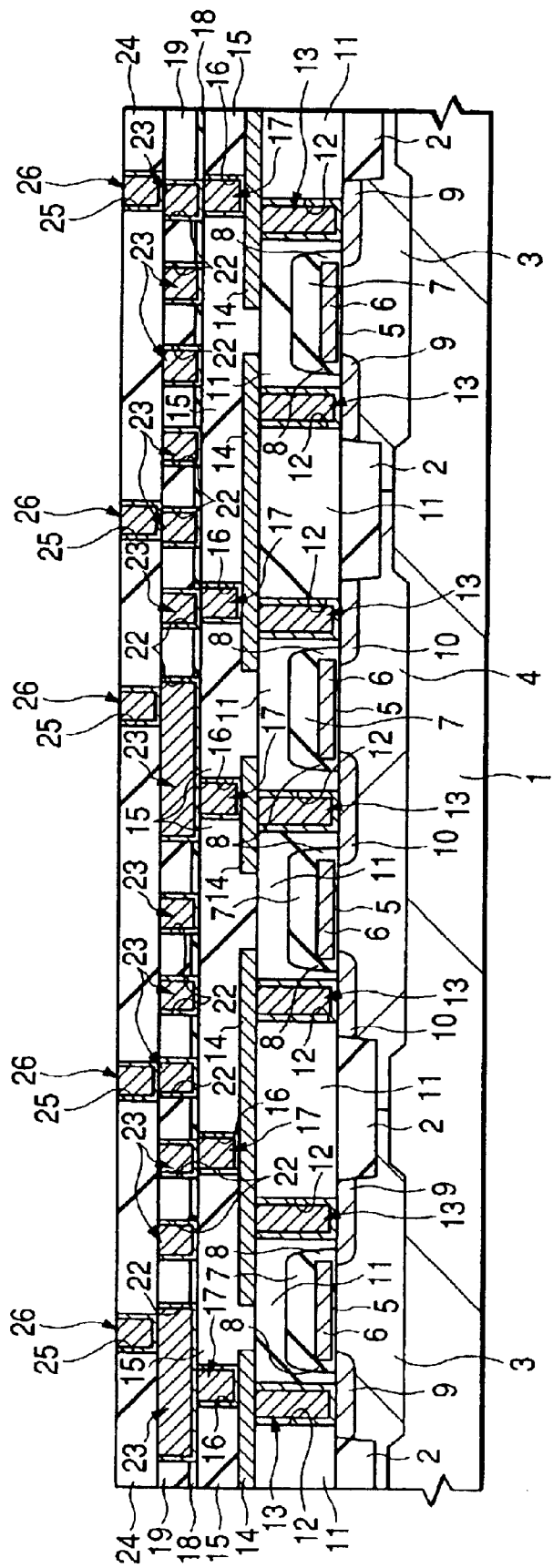
FIG. 14 is a fragmentary cross-sectional view of a semiconductor substrate for illustrating, in the order of the steps, one example of the manufacturing method of a semiconductor device according to Embodiment 1 of the present invention.

As illustrated in FIG. 14, an insulating film covering the interconnection 23 of the second metallization layer, for example, a silicon oxide film, is formed. This insulating film is then planarized by CMP to form the third interlayer insulating film 24. Over the third interlayer insulating film 24, a photoresist film having an opening in a region wherein a connection hole is to be made is formed, and using this photoresist film as a mask, the insulating film is etched. In this manner, a connecting hole 25 is formed in a predetermined region of the third interlayer insulating film 24.

A barrier metal layer is then formed over the whole surface of the semiconductor substrate 1, including the inside of the connecting hole 25, followed by the formation of a tungsten film to embed the connecting hole 25 therewith. The tungsten film and barrier metal layer are removed by CMP from a region outside the connecting hole 25, whereby a plug 26 is formed. As the barrier metal layer, a titanium nitride film can be used for example. The tungsten film functions as a main conductive layer and can be formed, for example, by CVD or sputtering.

Figure 15:
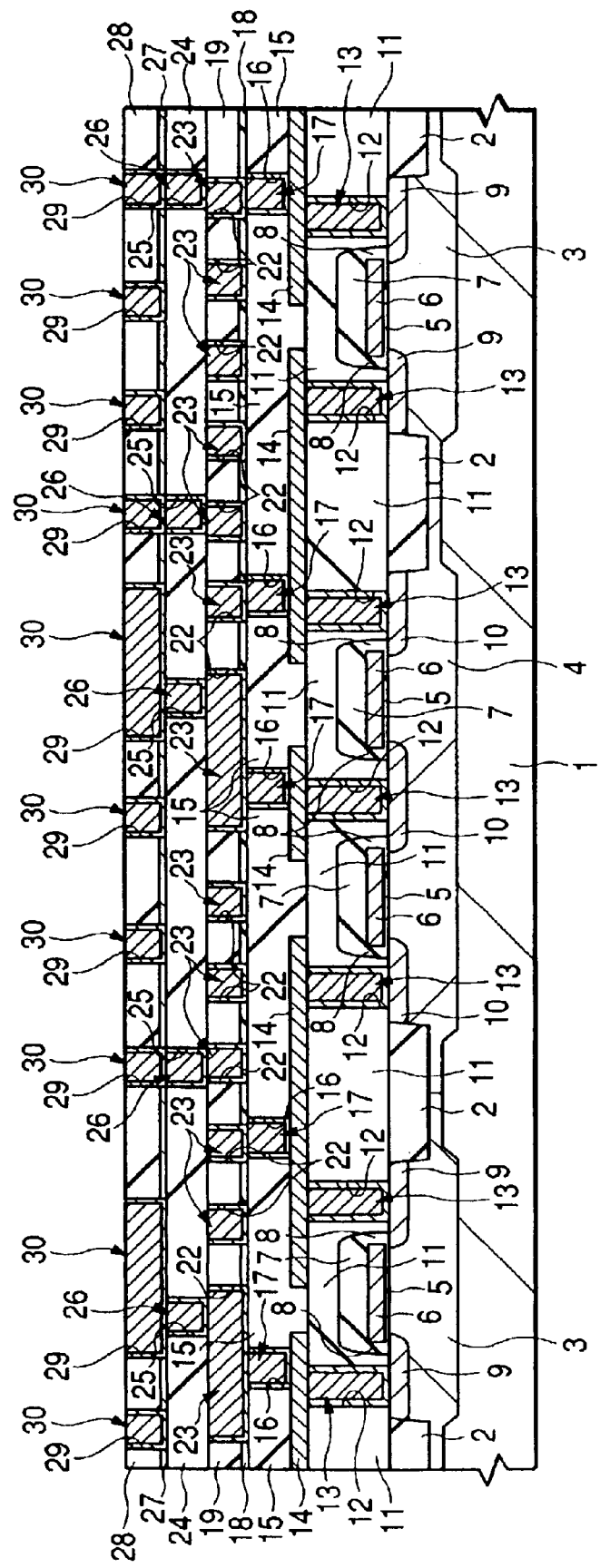
FIG. 15 is a fragmentary cross-sectional view of a semiconductor substrate for illustrating, in the order of the steps, one example of the manufacturing method of a semiconductor device according to Embodiment 1 of the present invention.

As illustrated in FIG. 15, the third metallization layer is formed in a similar manner to that employed for the second metallization layer. More specifically, a stopper insulating film 27, an insulating film 28 and a hard mask (not illustrated) are formed successively over the plug 26 and the third interlayer insulating film 24. This stopper insulating film 27 is formed of a material having a higher etching selectivity relative to the insulating film 28, for example, an organic SOG film to be formed by an application method similar to that used for the above-described stopper insulating film 18. The stopper insulating film is not limited to an organic SOG film, but an organic low-dielectric-constant film having a high etching selectivity relative to the insulating film 28 and has a lower dielectric constant than a silicon oxide film can also be used.

As the insulating film 28, similar to the above-described insulating film 19, a TEOS oxide film formed by plasma CVD using TEOS gas and $O_3$ gas as raw material gases can be used. Not only a TEOS oxide film but also an insulating film having a lower dielectric constant than a silicon nitride film can be used.

As the hard mask, similar to the above-described hard mask 20, a tungsten film, titanium nitride film, tantalum nitride film or aluminum film can be used.

A resist film which has been patterned into an interconnection groove pattern by photolithography is formed over the hard mask, followed by dry etching, whereby the interconnection groove pattern is transferred to the hard mask. The resist film is then removed by ashing with oxygen plasma. The organic SOG film constituting the stopper insulating film 27 has been covered with the insulating film 28 so that it is not exposed to oxygen plasma. The organic SOG film is therefore free from deterioration due to oxygen plasma.

Using the patterned hard mask as a mask and the stopper insulating film 27 as an etching stopper, a portion of an interconnection groove 29 is formed in the insulating film 28 (first etching). Using the above-described hard mask as a mask, another portion of the interconnection groove 29 is formed in the stopper insulating film 27 (second etching). This second etching can be conducted by either one of the above-described first or second method.

Next, an interconnection 30 of the third metallization layer is formed inside of the interconnection groove 29. The interconnection 30 has a barrier metal layer and a main conductive layer. The barrier metal layer is made of, for example, a titanium nitride film, while the main conductive layer is made of, for example, copper. The interconnection 30 is formed in the following manner. A titanium nitride film is formed all over the surface of the semiconductor substrate 1, including the inside of the interconnection groove 29, followed by the formation of a copper film to embed the interconnection groove 29 therewith. This titanium nitride film is formed, for example, by CVD, while the copper film is formed, for example, by a plating method. Prior to the formation of the copper film by plating, a copper seed layer can be formed, for example, by sputtering. The copper film and titanium nitride film are then removed by CMP from a region outside the interconnection groove 29 to form an interconnection 31 of the third metallization layer.

Figure 16:
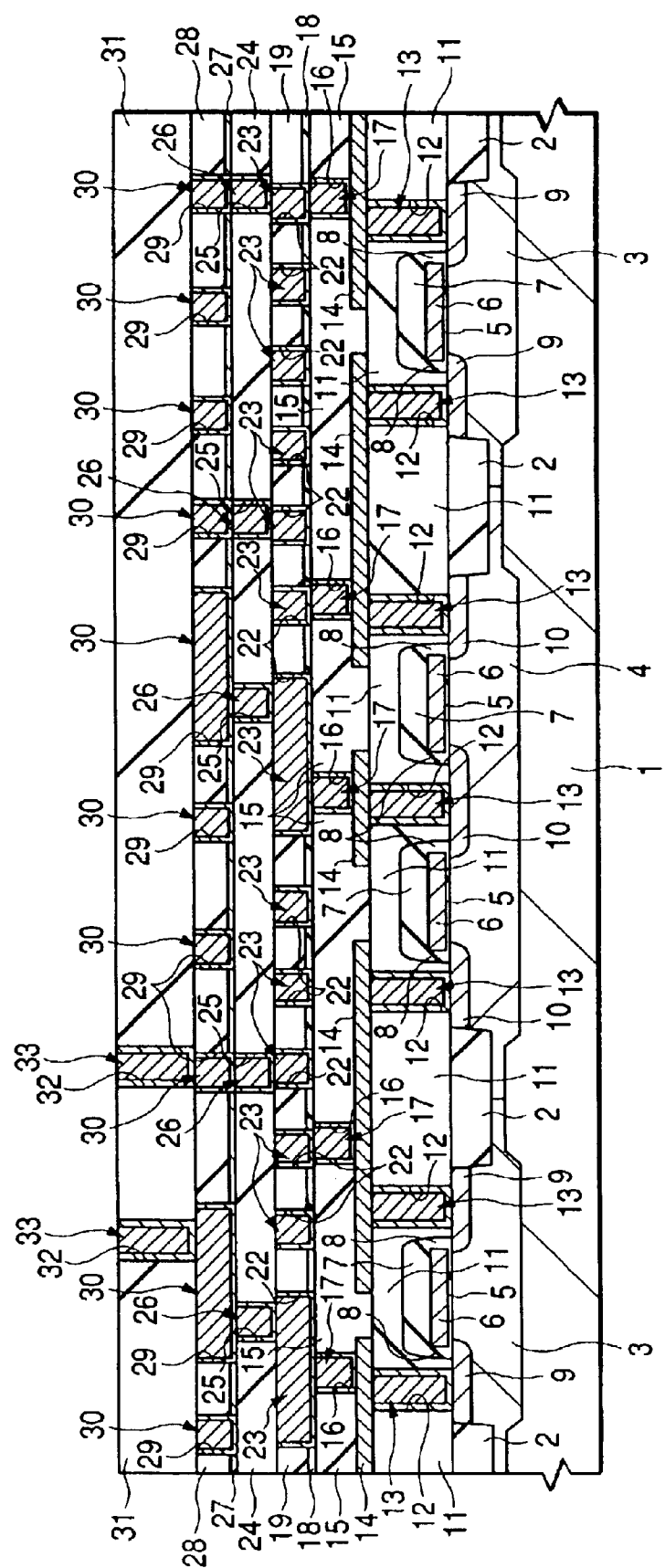
FIG. 16 is a fragmentary cross-sectional view of a semiconductor substrate for illustrating, in the order of the steps, one example of the manufacturing method of a semiconductor device according to Embodiment 1 of the present invention.

As illustrated in FIG. 16, an insulating film covering the interconnection 30 of the third metallization layer, for example, a silicon oxide film is formed. This insulating film is planarized by CMP to form a fourth interlayer insulating film 31. A photoresist film having an opening in a region wherein a connecting hole is to be made is formed over the fourth interlayer insulating film 31. Using this photoresist film as a mask, the insulating film is etched, whereby a connecting hole 32 is formed in a predetermined region of the fourth interlayer insulating film 31.

A barrier metal layer is then formed all over the surface of the semiconductor substrate 1, including the inside of the connecting hole 32, followed by the formation of a tungsten film to embed the connecting hole 32 therewith. The tungsten film and barrier metal layer are removed by CMP from a region outside the connecting hole 32, whereby a plug 33 is formed. As the barrier metal layer, a titanium nitride film can be used, for example. The tungsten film functions as a main conductive layer and can be formed, for example, by CVD or sputtering.

Figure 17:
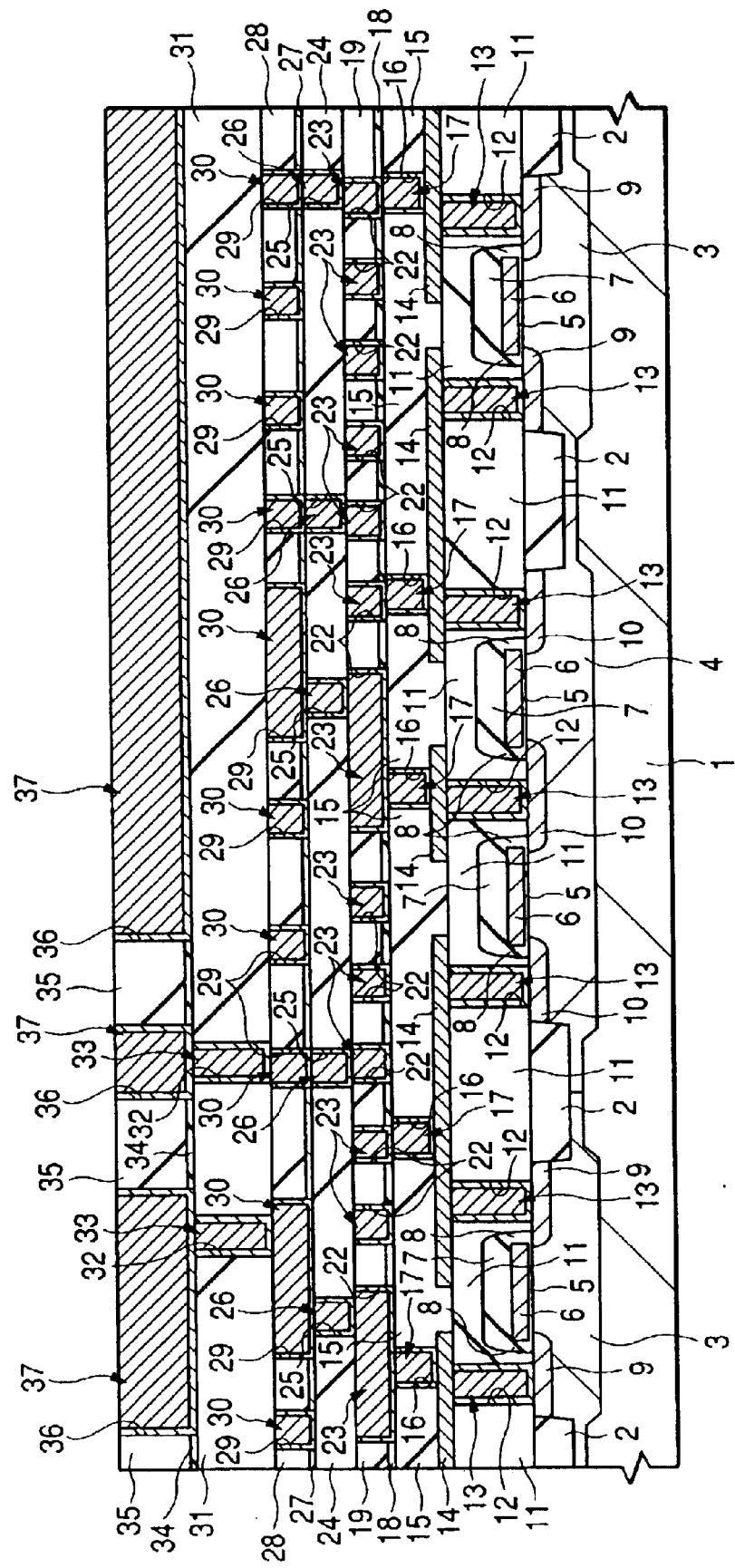
FIG. 17 is a fragmentary cross-sectional view of a semiconductor substrate for illustrating, in the order of the steps, one example of the manufacturing method of a semiconductor device according to Embodiment 1 of the present invention.

As illustrated in FIG. 17, the fourth metallization layer is formed in a similar manner to that employed for the second metallization layer. More specifically, a stopper insulating film 34, an insulating film 35 and a hard mask (not illustrated) are formed successively over the plug 33 and the fourth interlayer insulating film 31. The stopper insulating film 34 is formed of a material having a higher etching selectivity relative to the insulating film 35, for example, an organic SOG film to be formed by an application method similar to that used for the above-described stopper insulating film 18. The stopper insulating is not limited to use of an organic SOG film, but an organic low-dielectric-constant film having a higher etching selectivity relative to the insulating film 35 and having a lower dielectric constant than a silicon oxide film can be used.

As the insulating film 35, similar to the above-described insulating film 19, a TEOS oxide film formed by plasma CVD using TEOS gas and $O_3$ gas as raw material gases can be used. Not only a TEOS oxide film, but also an insulating film having a lower dielectric constant than a silicon nitride film can be used.

As the hard mask, similar to the above-described hard mask 20, a tungsten film, titanium nitride film, tantalum nitride film or aluminum film can be used.

A resist film which has been patterned into an interconnection groove pattern by photolithography is formed over the hard mask, followed by dry etching, whereby the interconnection groove pattern is transferred to the hard mask. The resist film is then removed by ashing with oxygen plasma. The organic SOG film constituting the stopper insulating film 34 has been covered with the insulating film 35 so that it is not exposed to oxygen plasma. The organic SOG film is therefore free from deterioration due to oxygen plasma.

Using the patterned hard mask as a mask and the stopper insulating film 34 as an etching stopper, a portion of the interconnection groove 36 is formed in the insulating film 35 (first etching). Using the above-described hard mask as a mask, another portion of the interconnection groove 36 is formed in the stopper insulating film 34 (second etching). This second etching can be conducted by either one of the above-described first or second method.

Next, an interconnection 37 of the fourth metallization layer is formed inside of the interconnection groove 36. The interconnection 37 has a barrier metal layer and a main conductive layer. The barrier metal layer is made of, for example, a titanium nitride film, while the main conductive layer is made of, for example, copper. The interconnection 37 is formed in the following manner. A titanium nitride film is formed all over the surface of the semiconductor substrate 1, including the inside of the interconnection groove 36, followed by the formation of a copper film to embed the interconnection groove 36 therewith. This titanium nitride film is formed, for example, by a CVD, while the copper film is formed, for example, by plating method. Prior to the formation of the copper film plating, a copper seed layer can be formed, for example, by sputtering. The copper film and titanium nitride film are then removed by CMP from a region other than the interconnection groove 36 to form the interconnection 37.

Figure 18:
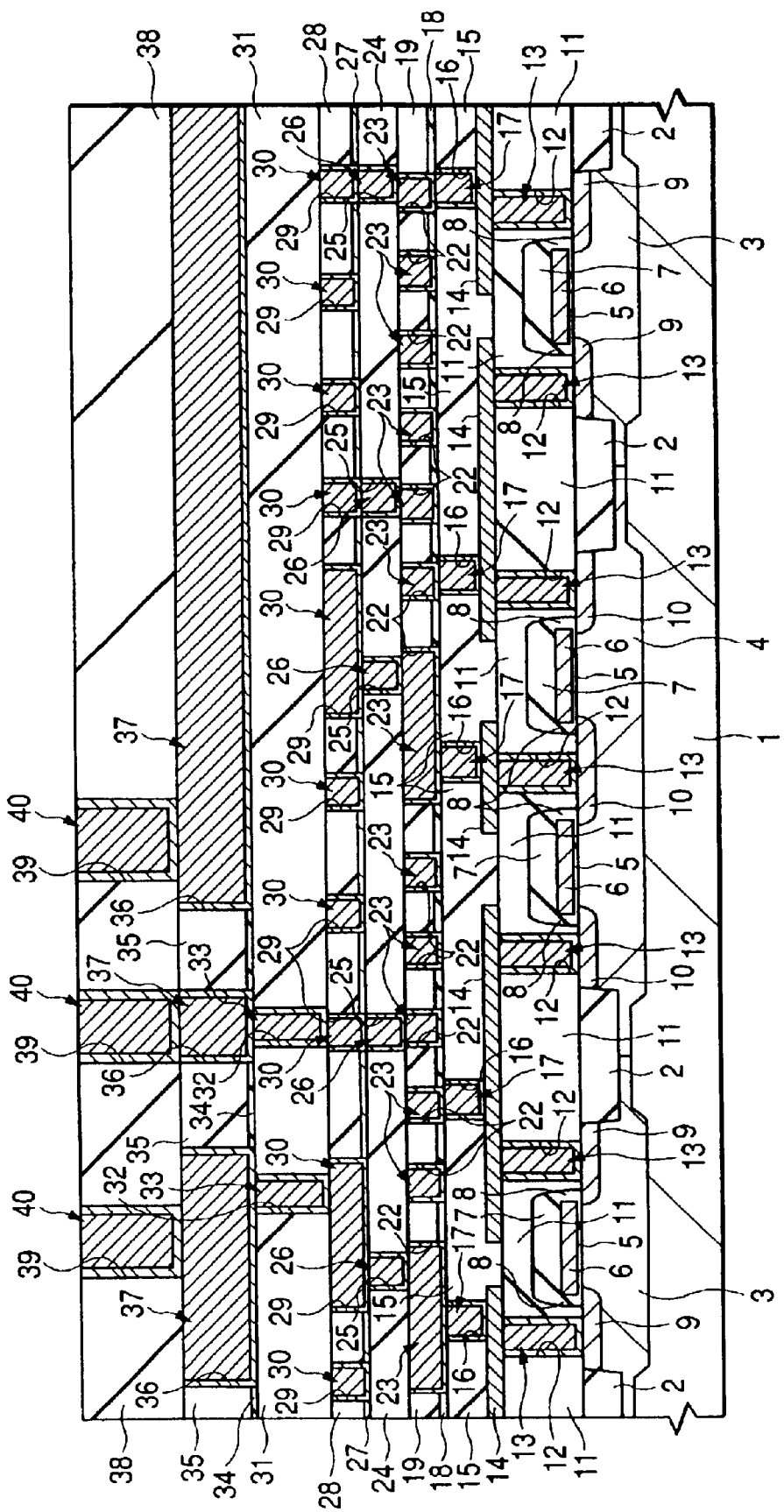
FIG. 18 is a fragmentary cross-sectional view of a semiconductor substrate for illustrating, in the order of the steps, one example of the manufacturing method of a semiconductor device according to Embodiment 1 of the present invention.

As illustrated in FIG. 18, an insulating film covering the interconnection 37 of the fourth metallization layer, for example, a silicon oxide film, is formed. This insulating film is planarized by CMP to form a fifth interlayer insulating film 38. A photoresist film having an opening in a region wherein a connecting hole is to be made is formed over the fifth interlayer insulating film 38. Using this photoresist film as a mask, the insulating film is etched, whereby a connecting hole 39 is formed in a predetermined region of the fifth interlayer insulating film 38.

A barrier metal layer is then formed all over the surface of the semiconductor substrate 1, including the inside of the connecting hole 39, followed by the formation of a tungsten film to embed the connecting hole 39 therewith. The tungsten film and barrier metal layer are removed by CMP from a region outside the connecting hole 39, whereby a plug 40 is formed. As the barrier metal layer, a titanium nitride film can be used, for example. The tungsten film functions as a main conductive layer and can be formed, for example, by CVD or sputtering.

Figure 19:
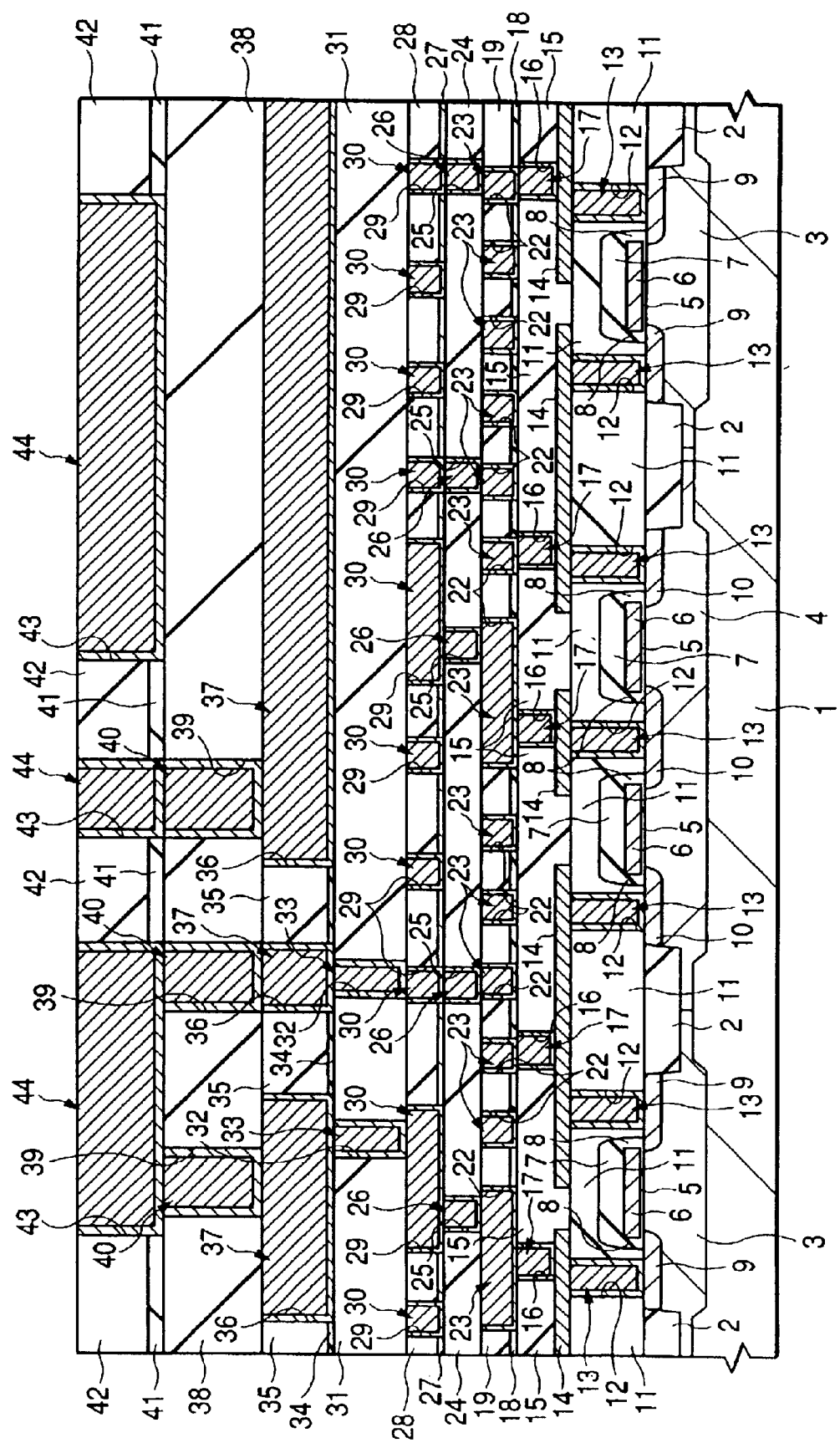
FIG. 19 is a fragmentary cross-sectional view of a semiconductor substrate for illustrating, in the order of the steps, one example of the manufacturing method of a semiconductor device according to Embodiment 1 of the present invention.

As illustrated in FIG. 19, the fifth metallization layer is formed in a similar manner to that employed for the second metallization layer. More specifically, a stopper insulating film 41, an insulating film 42 and a hard mask (not illustrated) are formed successively over the plug 40 and the fifth interlayer insulating film 38. The stopper insulating film 41 is formed of a material having a higher etching selectivity relative to the insulating film 42, for example, an organic SOG film to be formed by an application method similar to that used for the above-described stopper insulating film 18. The stopper insulating film is not limited to an organic SOG film, but any organic low-dielectric-constant film having a higher etching selectivity relative to the insulating film 42 and having a lower dielectric constant than a silicon oxide film can be used.

As the insulating film 42, similar to the above-described insulating film 19, a TEOS oxide film formed by plasma CVD using TEOS gas and $O_3$ gas as raw material gases can be used. Not only a TEOS oxide film, but also an insulating film having a lower dielectric constant than a silicon nitride film can be used.

As the hard mask, similar to the above-described hard mask 20, a tungsten film, titanium nitride film, tantalum nitride film or aluminum film can be used.

A resist film which has been patterned into an interconnection groove pattern by photolithography is formed over the hard mask, followed by dry etching, whereby the interconnection groove pattern is transferred to the hard mask. The resist film is then removed by ashing with oxygen plasma. The organic SOG film constituting the stopper insulating film 41 has been covered with the insulating film 42 so that it is not exposed to oxygen plasma. The organic SOG film is therefore free from deterioration due to oxygen plasma.

Using the patterned hard mask as a mask and the stopper insulating film 41 as an etching stopper, a portion of the interconnection groove 43 is formed in the insulating film 42 (first etching). Using the above-described hard mask as a mask, another portion of the interconnection groove 43 is formed in the stopper insulating film 41 (second etching). This second etching can be conducted by either one of the above-described first or second method.

Next, an interconnection 44 of the fifth metallization layer is formed inside of the interconnection groove 43. The interconnection 44 has a barrier metal layer and a main conductive layer. The barrier metal layer is made of, for example, a titanium nitride film, while the main conductive layer is made of, for example, copper. The interconnection 44 is formed in the following manner. A titanium nitride film is formed all over the surface of the semiconductor substrate 1 including the inside of the interconnection groove 43, followed by the formation of a copper film to embed the interconnection groove 43 therewith. This titanium nitride film is formed, for example, by CVD, while the copper film is formed, for example, by a plating method. Prior to the formation of the copper film by plating, a copper seed layer can be formed, for example, by sputtering. The copper film and titanium nitride film are then removed by CMP from a region other than the interconnection groove 43 to form the interconnection 44.

In a similar manner, the desired number of metallization layers can be formed over the fifth metallization layer, but a detailed description thereof is omitted.

According to this Embodiment 1, as apparent from the detailed description of the second metallization layer, after transfer of the interconnection groove pattern to the hard mask 20 by using the resist film 21, which has been patterned into the interconnection pattern, the resist film 21 is removed by oxygen plasma; and, then, the insulating film 19 and stopper insulating film 18 are successively etched using the interconnection-groove-pattern-transferred hard mask 20 as a mask. Upon removal of the resist film 21, the organic SOG film which constitutes the stopper insulating film 18 and has low resistance to oxygen plasma is protected by the insulating film 19 made of a TEOS oxide film, so that it is free from the influence of oxygen plasma. Upon processing of the stopper insulating film 18, the organic SOG film constituting the stopper insulating film 18 is not exposed to oxygen plasma, because etching is carried out using the hard mask 20, which is to be removed later by etching or CMP, as a mask. Adoption of such a structure therefore makes it possible to prevent deterioration in the quality of the organic SOG film, which constitutes the stopper insulating film 18.

As apparent from the detailed description of the second metallization layer, use of the stopper insulating film 18 which is made of an organic SOG film having a relatively low dielectric constant of about 2 to 3 as an etching stopper upon formation of a groove in the insulating film 19 made of a TEOS oxide film makes it possible to constitute the insulating film, which surrounds the second metallization layer, from a TEOS oxide film and an organic SOG film having a lower dielectric constant than a silicon oxide film, thereby suppressing an increase in the capacitance between interconnections.

The other metallization layers (the third to fifth metallization layers shown in Embodiment 1) constituting the multilevel interconnection formed in a similar manner to that employed for the second metallization layer, so that similar advantages to the second metallization layer are available.

(Embodiment 2)

FIGS. 20 to 28 are fragmentary cross-sectional views each illustrating, in the order of steps, a method of manufacture of a semiconductor device according to Embodiment 2 of the present invention. In FIGS. 20 to 28, only the second metallization layer is illustrated.

Figure 20:
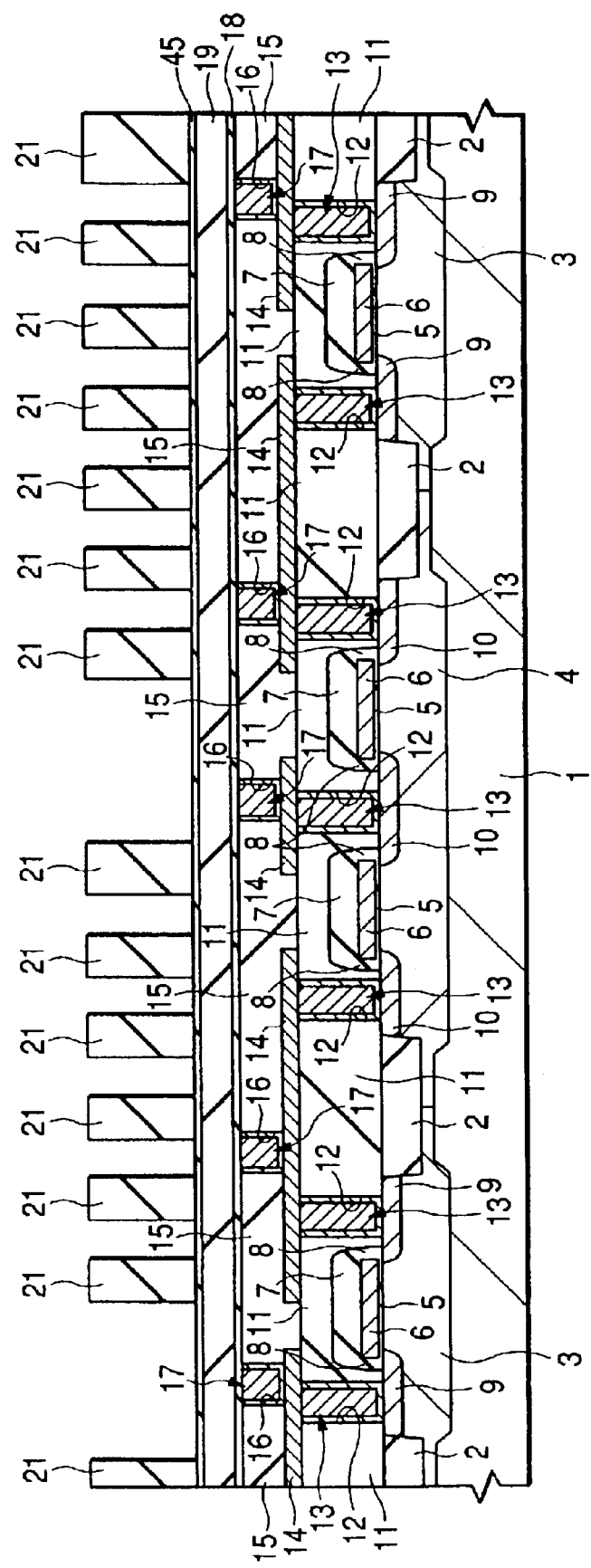
FIG. 20 is a fragmentary cross-sectional view of a semiconductor substrate for illustrating, in the order of the steps, one example of the manufacturing method of a semiconductor device according to another embodiment (Embodiment 2) of the present invention.

The manufacturing method according to Embodiment 2 is similar to that of Embodiment 1 up to the steps illustrated in FIG. 3. Then, as illustrated in FIG. 20, a stopper insulating film 18 and an insulating film 19 are successively deposited over the plug 16, followed by the formation of a hard mask 45. This hard mask 45 is made of, for example, a silicon nitride film and has a thickness of about 50 to 200 nm. The silicon nitride film constituting the hard mask 45 is formed, for example, by CVD, which permits a lowering of the film forming temperature.

Over the hard mask 45, a resist film 21 is formed by photolithography. The resist film 21 is then patterned in to an interconnection groove pattern in order to make an opening in a region wherein an interconnection groove is to be formed following the interconnection groove pattern.

Figure 21:
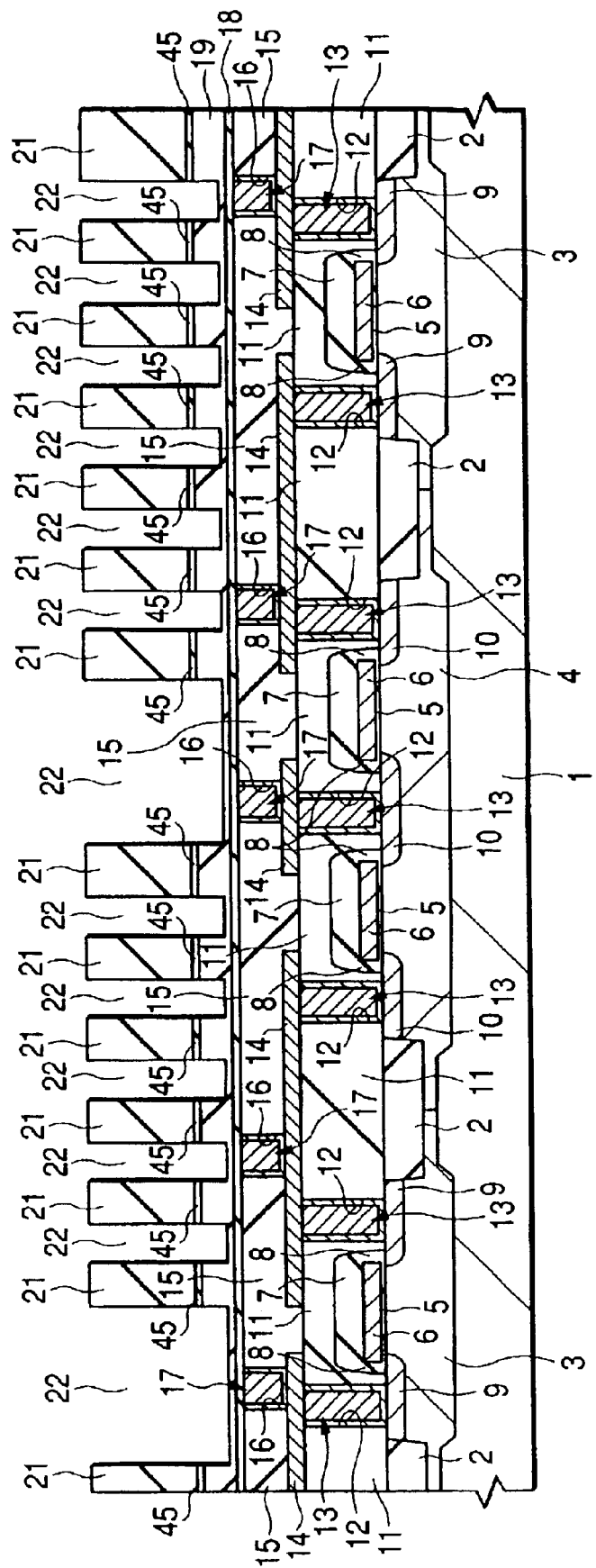
FIG. 21 is a fragmentary cross-sectional view of a semiconductor substrate for illustrating, in the order of the steps, one example of the manufacturing method of a semiconductor device according to Embodiment 2 of the present invention.

As illustrated in FIG. 21, the hard mask is dry etched in the presence of the resist film 21, whereby the interconnection groove pattern is transferred to the hard mask 45. The upper portion of the insulating film 19 is then etched to form a portion of the interconnection groove 22. Etching of this insulating film 19 is terminated, for example, just before the exposure of the surface of the stopper insulating film 18.

Figure 22:
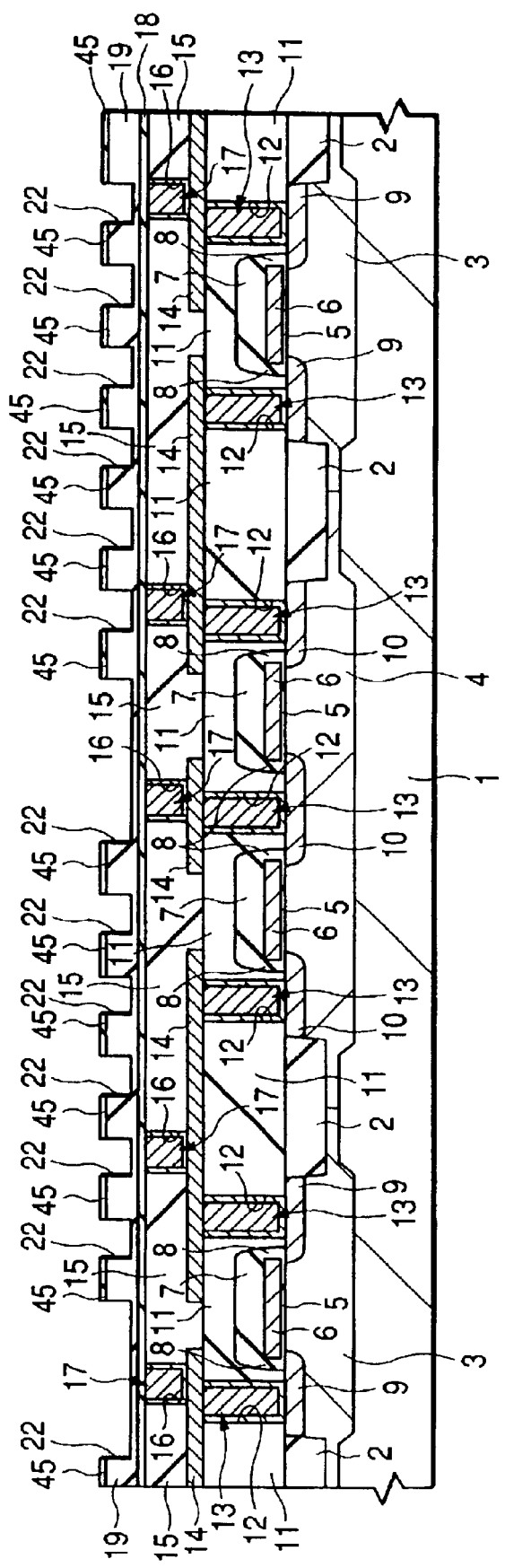
FIG. 22 is a fragmentary cross-sectional view of a semiconductor substrate for illustrating, in the order of the steps, one example of the manufacturing method of a semiconductor device according to Embodiment 2 of the present invention.

As illustrated in FIG. 22, the resist film 21 is removed by ashing with oxygen plasma. In this manner, the hard mask 45 having an interconnection groove pattern transferred thereto is formed. A portion of the interconnection groove 22 has been formed over the insulating film 19. Since the organic SOG film constituting the stopper insulating film 18 has been covered with the insulating film 19 having high resistance to oxygen plasma, it is free from exposure to oxygen plasma. This makes it possible to prevent a deterioration in the quality of the organic SOG film due to the oxygen plasma.

Figure 23:
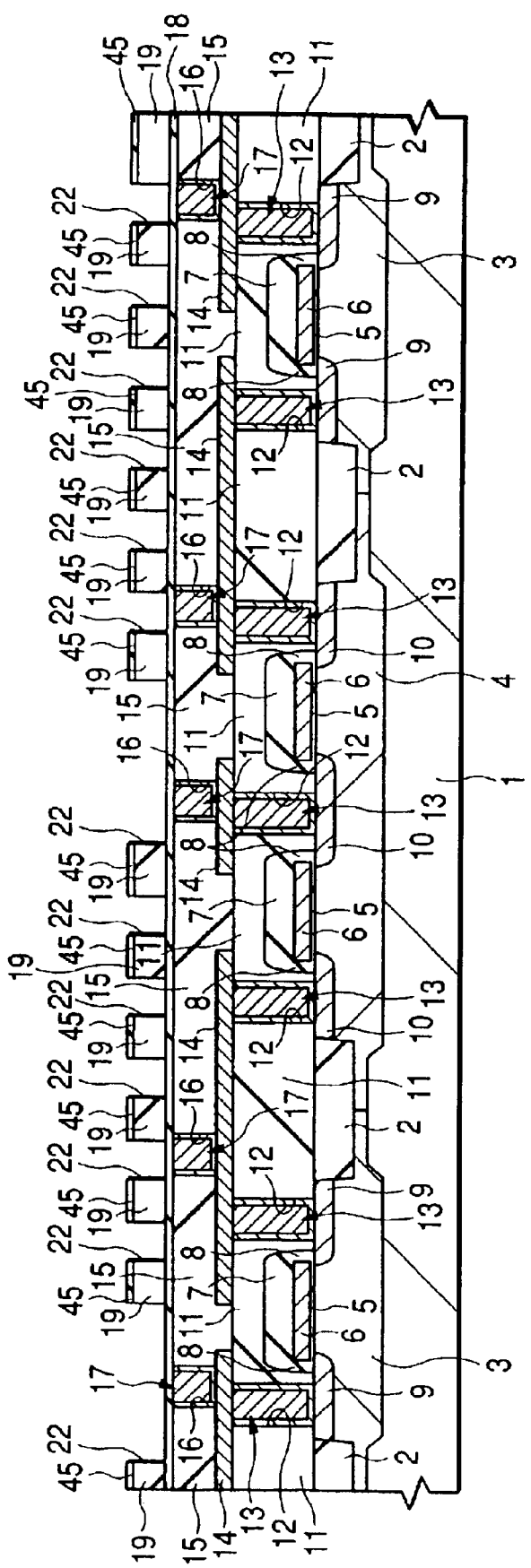
FIG. 23 is a fragmentary cross-sectional view of a semiconductor substrate for illustrating, in the order of the steps, one example of the manufacturing method of a semiconductor device according to Embodiment 2 of the present invention.
Figure 24:
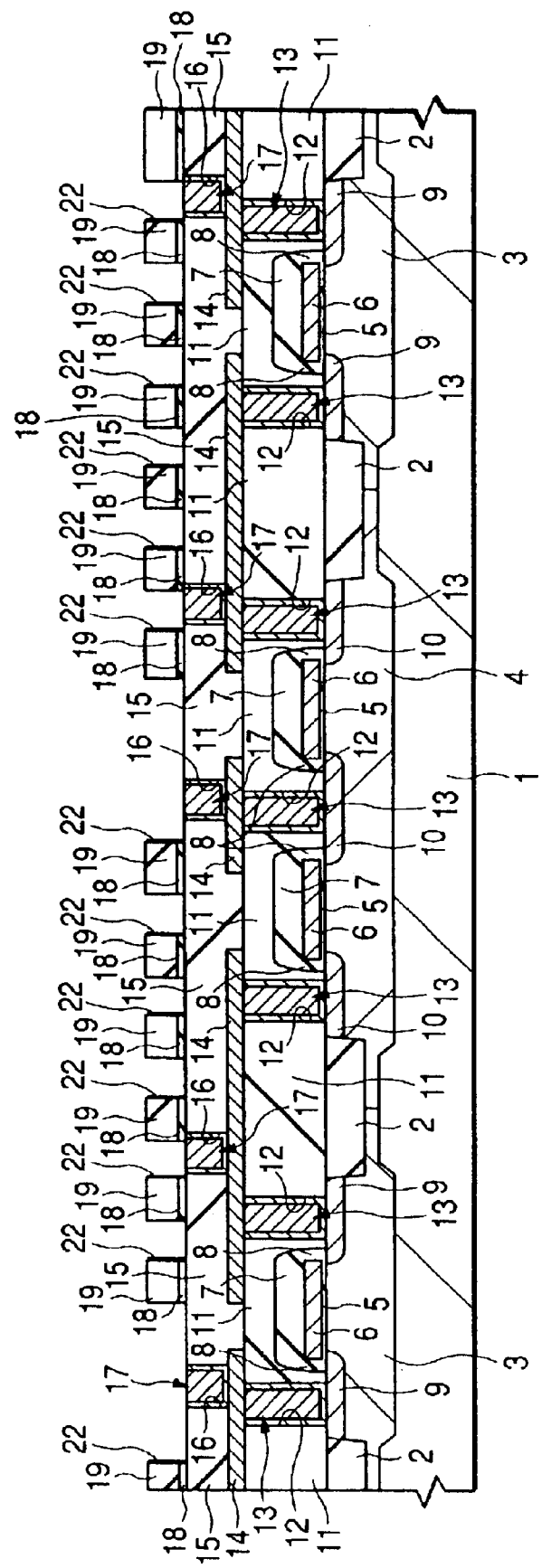
FIG. 24 is a fragmentary cross-sectional view of a semiconductor substrate for illustrating, in the order of the steps, one example of the manufacturing method of a semiconductor device according to Embodiment 2 of the present invention.

As illustrated in FIG. 23, first etching is conducted using the patterned hard mask 45 as a mask and the stopper insulating film 18 as an etching stopper. By this first etching, another portion of the interconnection groove 22 is formed below the remaining insulating film 19. This etching is conducted under conditions which permit easy etching of the insulating film 19 (TEOS oxide film), but do not permit easy etching of the hard mask 45 and stopper insulating film 18 (organic SOG film), for example, conditions which make the etching selectivity to the silicon nitride film not less than 10 relative to the TEOS oxide film.

Then, using the hard mask 45 as a mask, second etching is conducted. By this second etching, an exposed portion of the stopper insulating film 18 is removed, followed by the formation of the remaining portion of the interconnection groove 22 in the stopper insulating film 18. This etching can be conducted by either one of the following two methods.

The first one is to select a condition under which the etching selectivity to the hard mask 45 is lower than that to the stopper insulating film 18 (organic SOG film). By this etching, the hard mask 45 and the stopper insulating film 18 are etched at a substantially similar rate.

The second one is to select a condition under which the etching selectivity to the hard mask 45 is higher than that to the stopper insulating film 18 (organic SOG film). By this etching, the stopper insulating film is etched, but the hard mask 45 is not etched easily.

Figure 25:
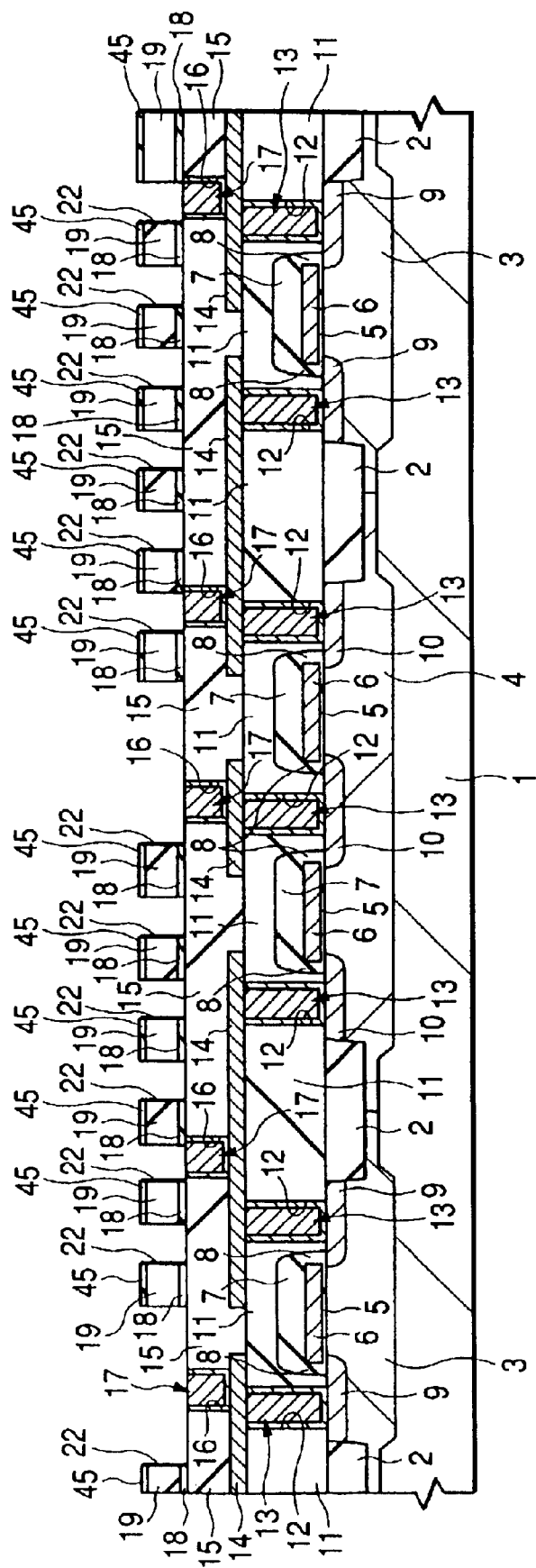
FIG. 25 is a fragmentary cross-sectional view of a semiconductor substrate for illustrating, in the order of the steps, one example of the manufacturing method of a semiconductor device according to Embodiment 2 of the present invention.
Figure 26:
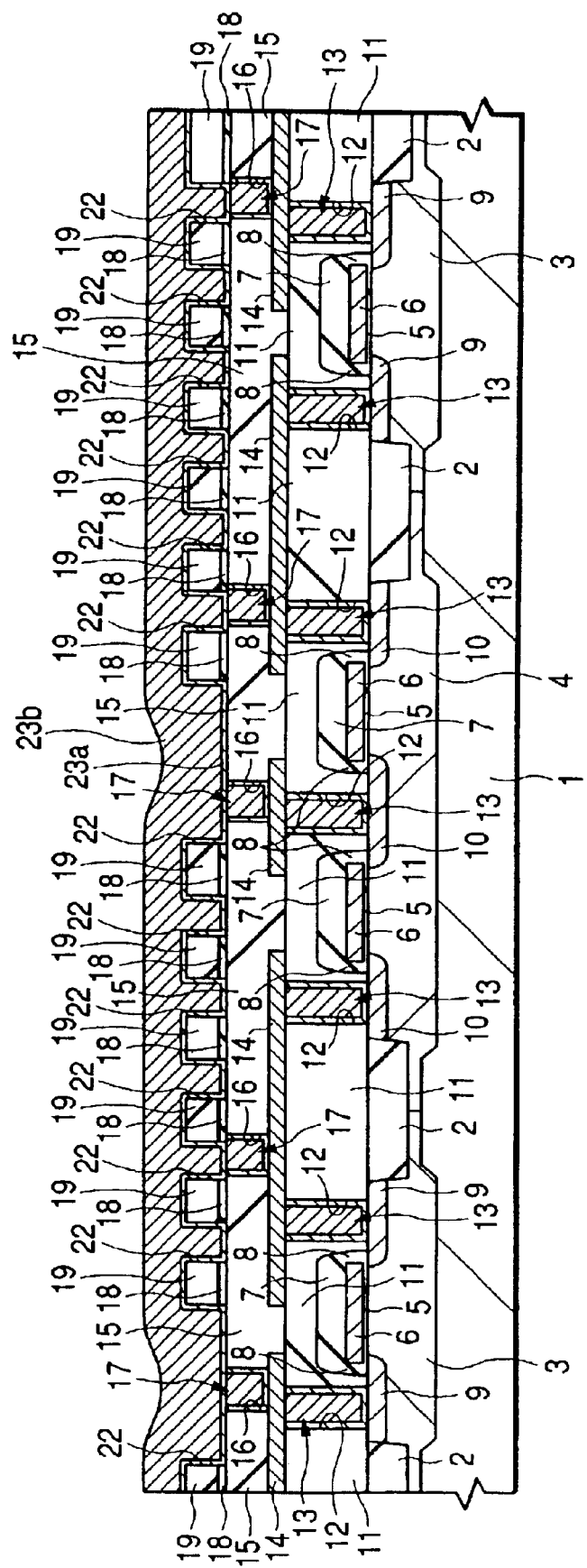
FIG. 26 is a fragmentary cross-sectional view of a semiconductor substrate for illustrating, in the order of the steps, one example of the manufacturing method of a semiconductor device according to Embodiment 2 of the present invention.
Figure 27:
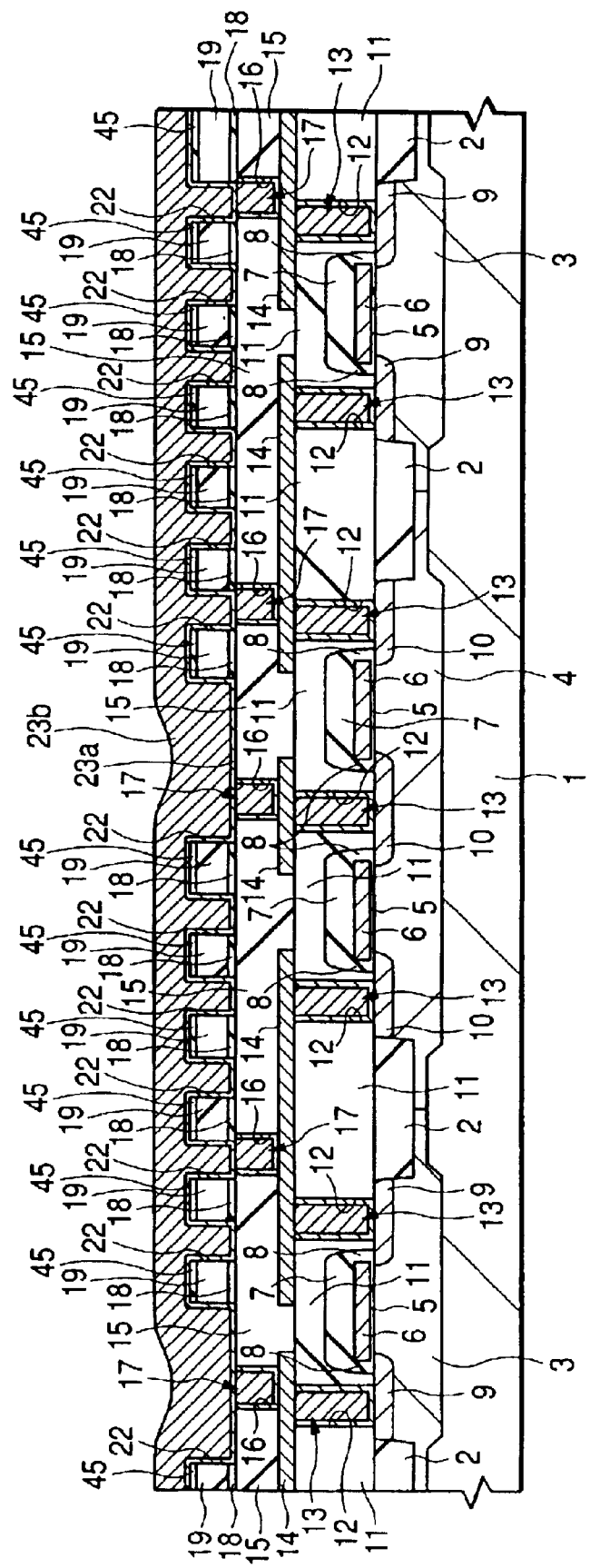
FIG. 27 is a fragmentary cross-sectional view of a semiconductor substrate for illustrating, in the order of the steps, one example of the manufacturing method of a semiconductor device according to Embodiment 2 of the present invention.

In a similar manner to the step as illustrated in FIG. 10 of Embodiment 1, an interconnection 23 of the second metallization layer is formed inside of the interconnection groove 22. FIG. 26 illustrates the barrier metal layer 23a, seed layer (not illustrated) and copper-plated layer 23b formed in the interconnection groove 22, which has been made by removing the stopper insulating film 18 by the first method described with reference to FIG. 24. FIG. 27 illustrates the barrier metal layer 23a, seed layer (not illustrated) and copper-plated layer 23b formed in the interconnection groove 22, which has been made by removing the stopper insulating film 18 by the second method described with reference to FIG. 25.

Figure 28:
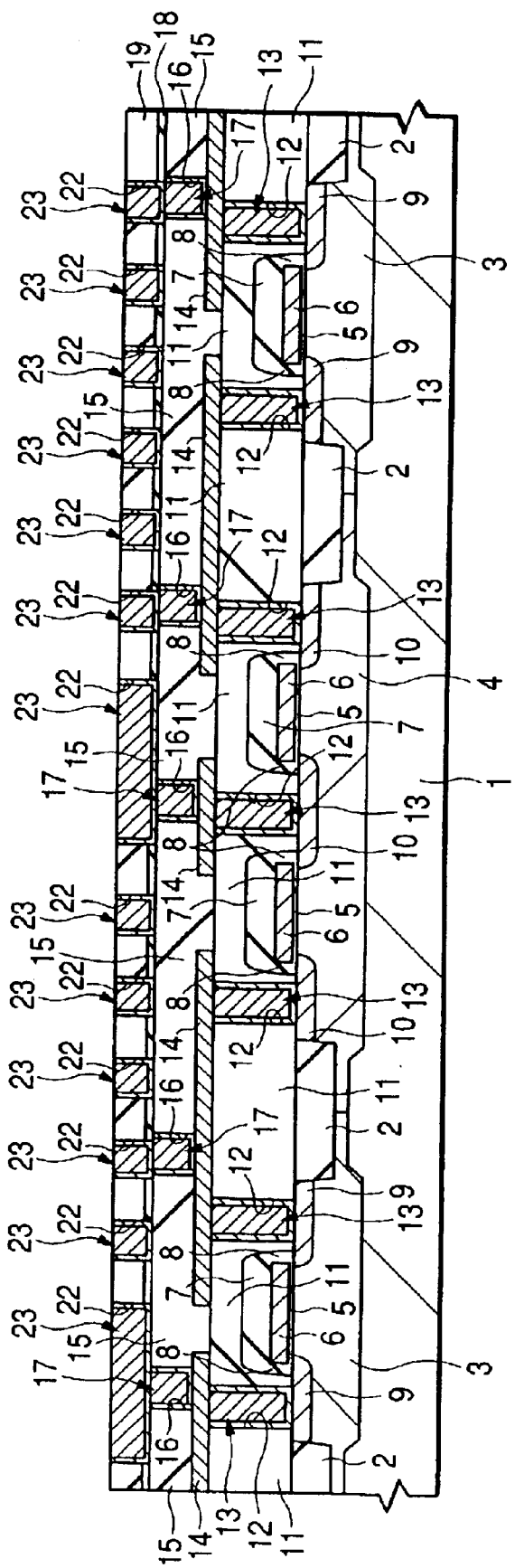
FIG. 28 is a fragmentary cross-sectional view of a semiconductor substrate for illustrating, in the order of the steps, one example of the manufacturing method of a semiconductor device according to Embodiment 2 of the present invention.

As illustrated in FIG. 28, the plated layer 23b and seed layer are polished by CMP. Polishing is continued further to remove even the barrier metal layer 23a over the insulating film 19, whereby the barrier metal layer 23a and copper films (plated layer 23 and seed layer) are removed from a region outside the interconnection groove 22.

Upon-removal of the stopper insulating film 18 by the first method as described above with reference to FIG. 24, removal by CMP is continued until completion of the removal of the barrier metal layer 23a on the insulating film 19. Upon removal of the stopper insulating film 18 by the second method, as illustrated in FIG. 25, on the other hand, removal by CMP is continued until the removal of both the barrier metal 23a on the insulating film 19 and the hard mask 45 is completed.

In the above-described manner, the interconnection 23 of the second metallization layer according to Embodiment 2 is completed.

According to this Embodiment 2, even if a silicon nitride film is used as the hard mask 45, a deterioration in the quality of the organic SOG film can be suppressed, because the organic SOG film constituting the stopper insulating film 18 is free from the influence of the oxygen plasma as described above with reference to Embodiment 1. Another advantage of this Embodiment 2 is that an increase in the capacitance between interconnections can be suppressed by using, as the stopper insulating film 18, an organic SOG film having a low dielectric constant.

(Embodiment 3)

FIGS. 29 to 37 are fragmentary cross-sectional views each illustrating, in the order of steps, a method of manufacture of a semiconductor device according to Embodiment 3 of the present invention. In FIGS. 29 to 37, only a second metallization layer is illustrated.

Figure 29:
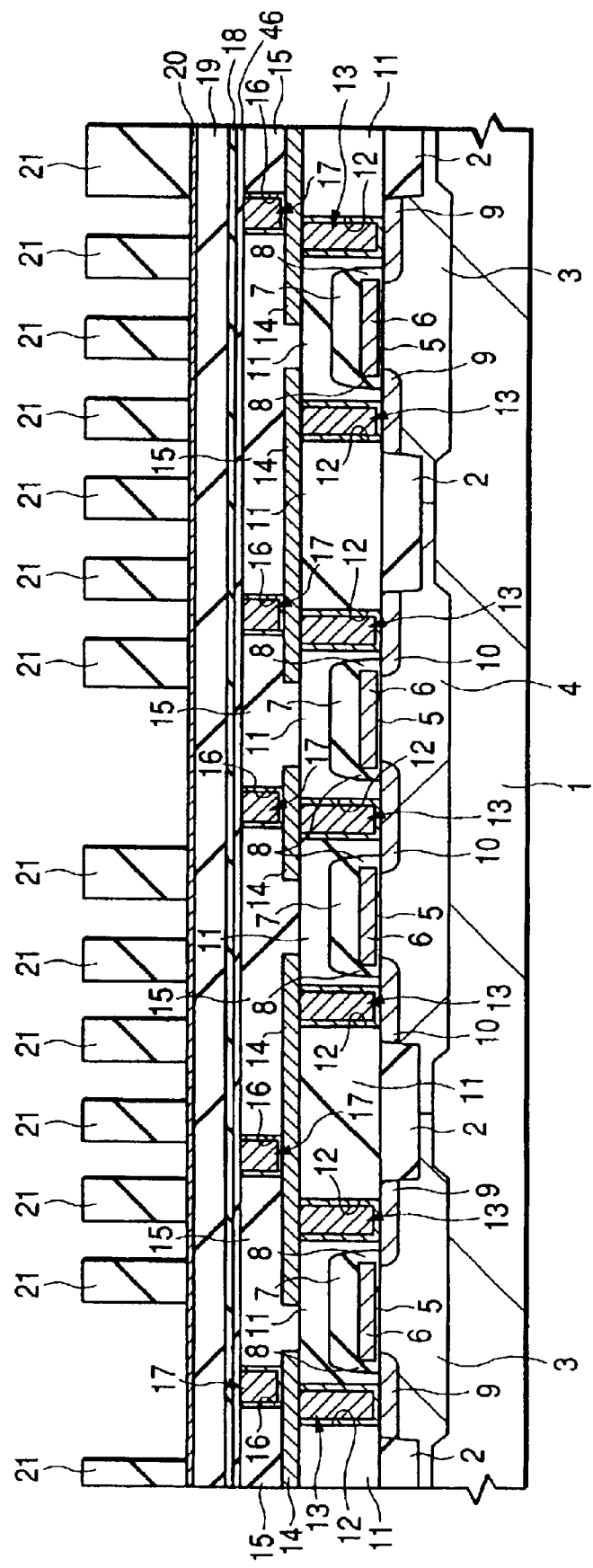
FIG. 29 is a fragmentary cross-sectional view of a semiconductor substrate for illustrating, in the order of the steps, one example of the manufacturing method of a semiconductor device according to a further embodiment (Embodiment 3) of the present invention.

In the method of manufacture of this Embodiment 3, after the steps similar to those of Embodiment 1, as illustrated in FIG. 3, the semiconductor substrate 1 is subjected to hydrogen ($H_2$) annealing. Hydrogen annealing is conducted, for example, under conditions of a temperature of 475□ C. and an annealing time of 5 minutes. Then, as illustrated in FIG. 29, an adhesion layer 46 is deposited over the plug 16, followed by successive formation of a stopper insulating film 18, an insulating film 19 and a hard mask 20. The adhesion layer 46 is made of, for example, a TEOS oxide film. Its thickness is set at 50 nm or less, for example, about 25 nm, so as to be removable by over etching upon removal of the stopper insulating film 18, which will be conducted later.

In the case of an embedding failure of the plug 17 in the connecting hole 16, a gap appears inside of the plug 17 and delamination of the stopper insulating film 18 over the plug 17 is caused by degassing from this gap. Hydrogen annealing after the formation of the plug 17, however, makes it possible to positively cause degassing from the gap of the plug 17, so that the stopper insulating film 18 is free from the influence of degassing. In addition, by the deposition of the adhesion layer 46 below the stopper insulating film 18, delamination of the stopper insulating film 18 due to the influence of degassing upon formation of the stopper insulating film 18 or insulating film 19 can be prevented even if the hydrogen annealing is insufficient. Effects for preventing delamination of the stopper insulating film 18 can also be brought about by either one of hydrogen annealing or formation of the adhesion layer 46.

A resist film 21 is then formed over the hard mask 20 by photolithography. This resist film 21 is patterned into an interconnection groove pattern so that an opening is formed in a region wherein an interconnection groove is formed.

Figure 30:
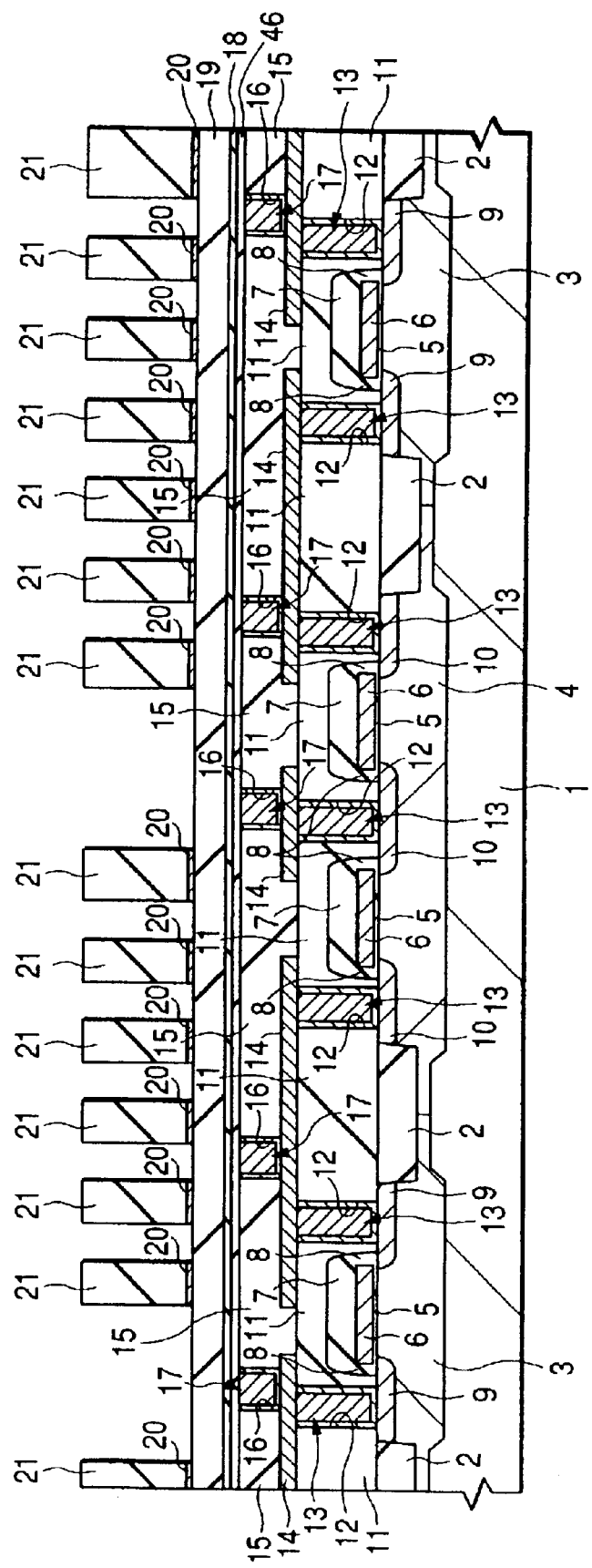
FIG. 30 is a fragmentary cross-sectional view of a semiconductor substrate for illustrating, in the order of the steps, one example of the manufacturing method of a semiconductor device according to Embodiment 3 of the present invention.
Figure 31:
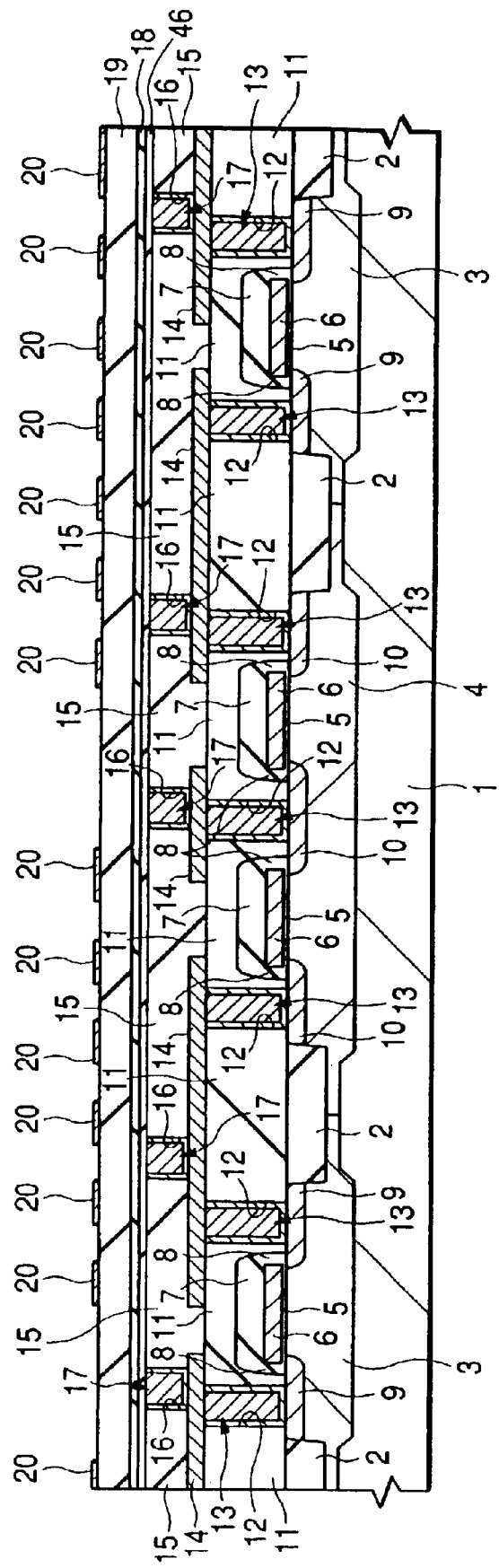
FIG. 31 is a fragmentary cross-sectional view of a semiconductor substrate for illustrating, in the order of the steps, one example of the manufacturing method of a semiconductor device according to Embodiment 3 of the present invention.

As illustrated in FIG. 30, the hard mask 20 is dry etched in the presence of the resist film 21 so as to transfer the interconnection groove pattern to the hard mask. As illustrated in FIG. 31, the resist film 21 is then removed by ashing with oxygen plasma. In this manner, the hard mask 20 having the interconnection groove pattern transferred thereto is formed. At this time, the organic SOG film constituting the stopper insulating film 18 has been covered with the insulating film 19 having a high resistance to oxygen plasma so that the organic SOG film is not exposed to oxygen plasma. Such a structure makes it possible to prevent a deterioration of the organic SOG film due to oxygen plasma.

Figure 32:
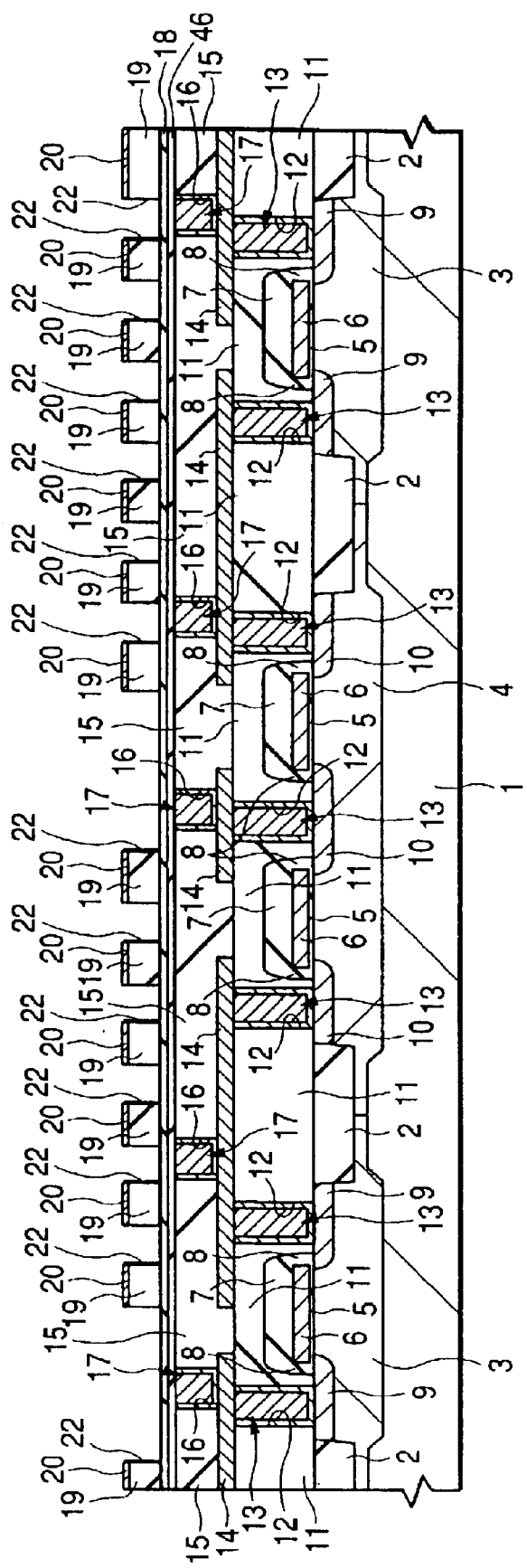
FIG. 32 is a fragmentary cross-sectional view of a semiconductor substrate for illustrating, in the order of the steps, one example of the manufacturing method of a semiconductor device according to Embodiment 3 of the present invention.
Figure 33:
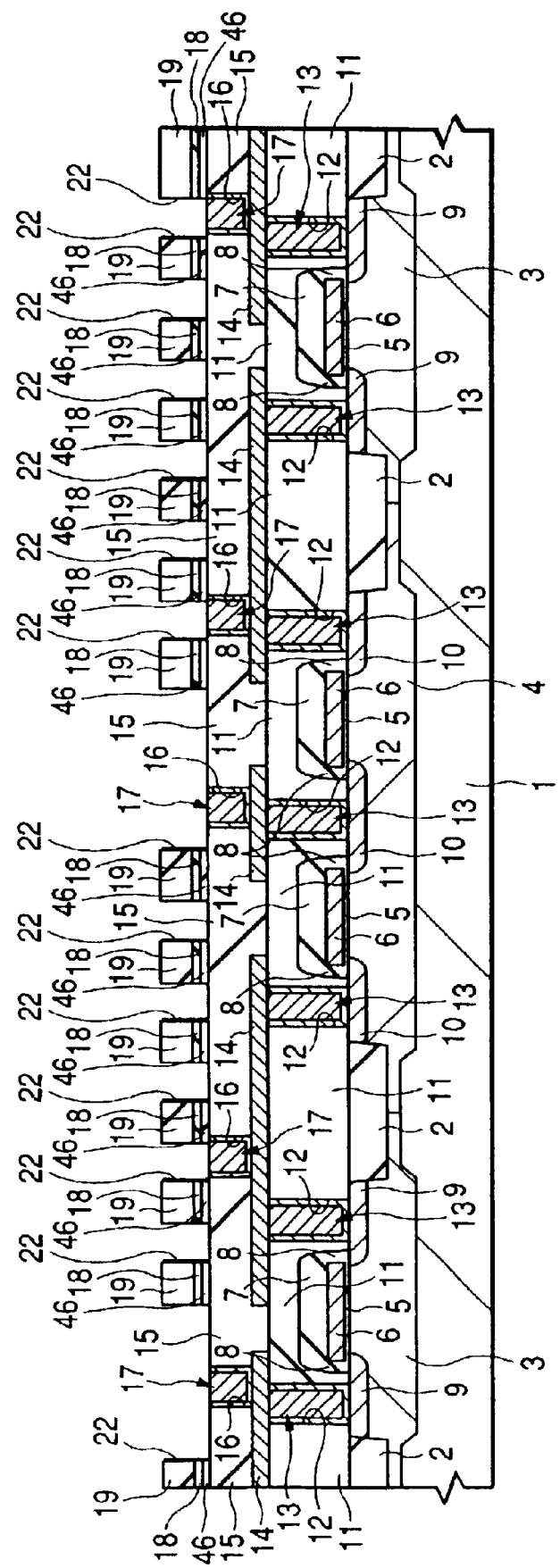
FIG. 33 is a fragmentary cross-sectional view of a semiconductor substrate for illustrating, in the order of the steps, one example of the manufacturing method of a semiconductor device according to Embodiment 3 of the present invention.

As illustrated in FIG. 32, using the patterned hard mask 20 as a mask and the stopper insulating film 18 as an etching stopper, first etching is conducted. By this first etching, a portion of the interconnection groove 22 is formed in the insulating film 19. The first etching is conducted under conditions permitting easy etching of the insulating film 19 (TEOS oxide film) and not permitting easy etching of the hard mask 20 and stopper insulating film 18 (organic SOG film).

Using the hard mask 20 as a mask, second etching is then conducted. By this second etching, an exposed portion of the stopper insulating film 18 and adhesion layer 46 are successively removed to form another portion of the interconnection groove 22 in the stopper insulating film 18 and adhesion layer 46. This etching can be conducted by either one of the following two methods.

The first method is to select a condition under which the etching selectivity to the hard mask 20 is lower than that to each of the stopper insulating film 18 (organic SOG film) and adhesion layer 46 (TEOS oxide film). By this etching, the hard mask 45 and the stopper insulating film 18, or the hard mask 20 and the adhesion layer 46, are etched at a substantially similar rate.

Figure 34:
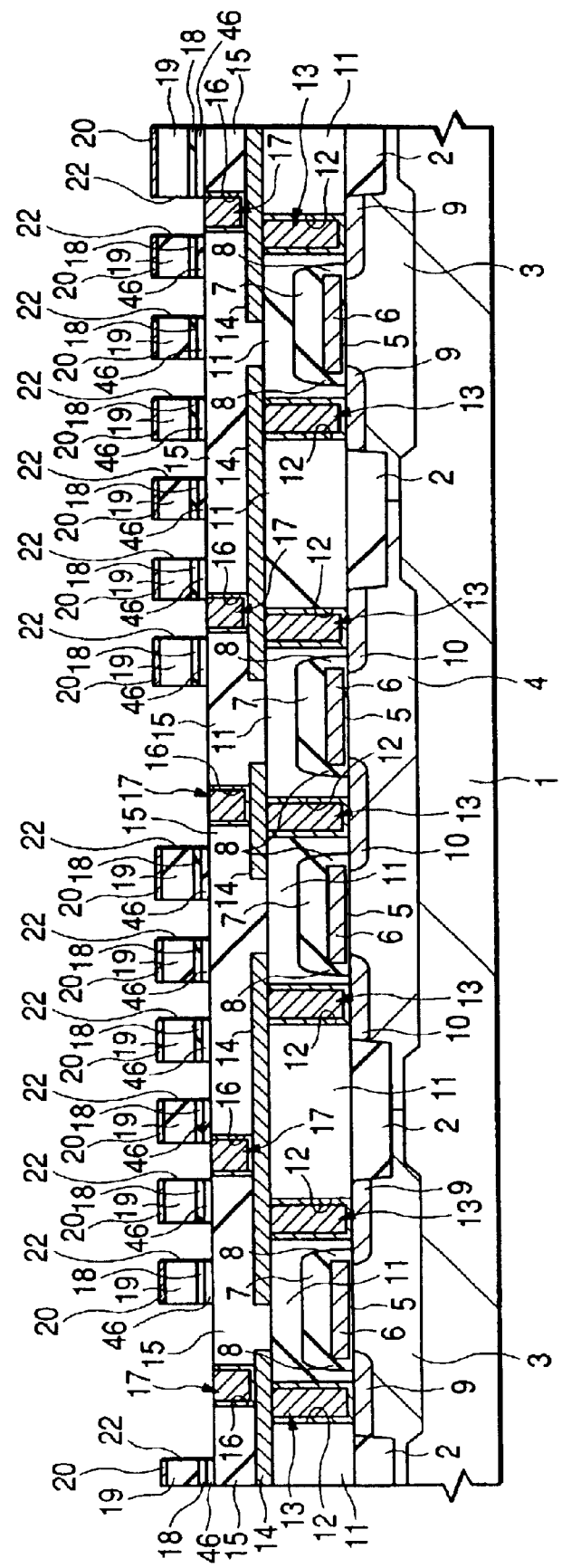
FIG. 34 is a fragmentary cross-sectional view of a semiconductor substrate for illustrating, in the order of the steps, one example of the manufacturing method of a semiconductor device according to Embodiment 3 of the present invention.

The second method is to select a condition under which the etching selectivity to the hard mask 20 is higher than that to each of the stopper insulating film 18 (organic SOG film) and adhesion layer 46 (TEOX oxide film), as illustrated in FIG. 34. By this etching, the stopper insulating film 18 is etched, but the hard mask 45 is not etched easily.

Figure 35:
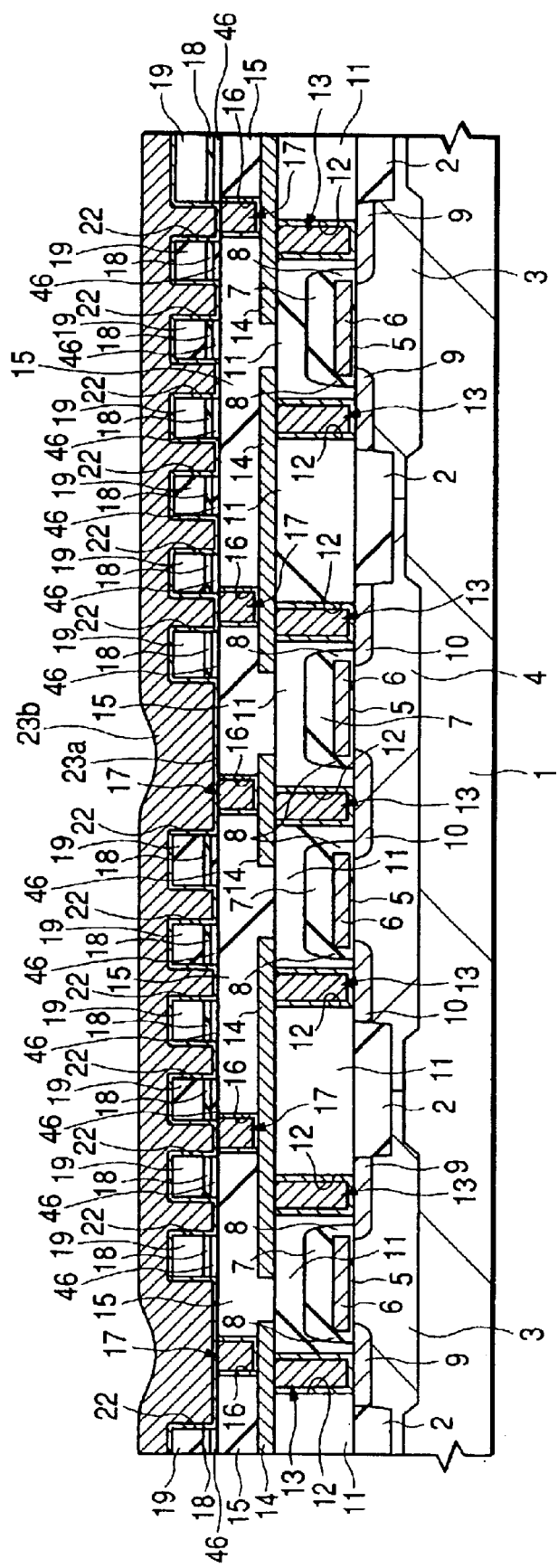
FIG. 35 is a fragmentary cross-sectional view of a semiconductor substrate for illustrating, in the order of the steps, one example of the manufacturing method of a semiconductor device according to Embodiment 3 of the present invention.
Figure 36:
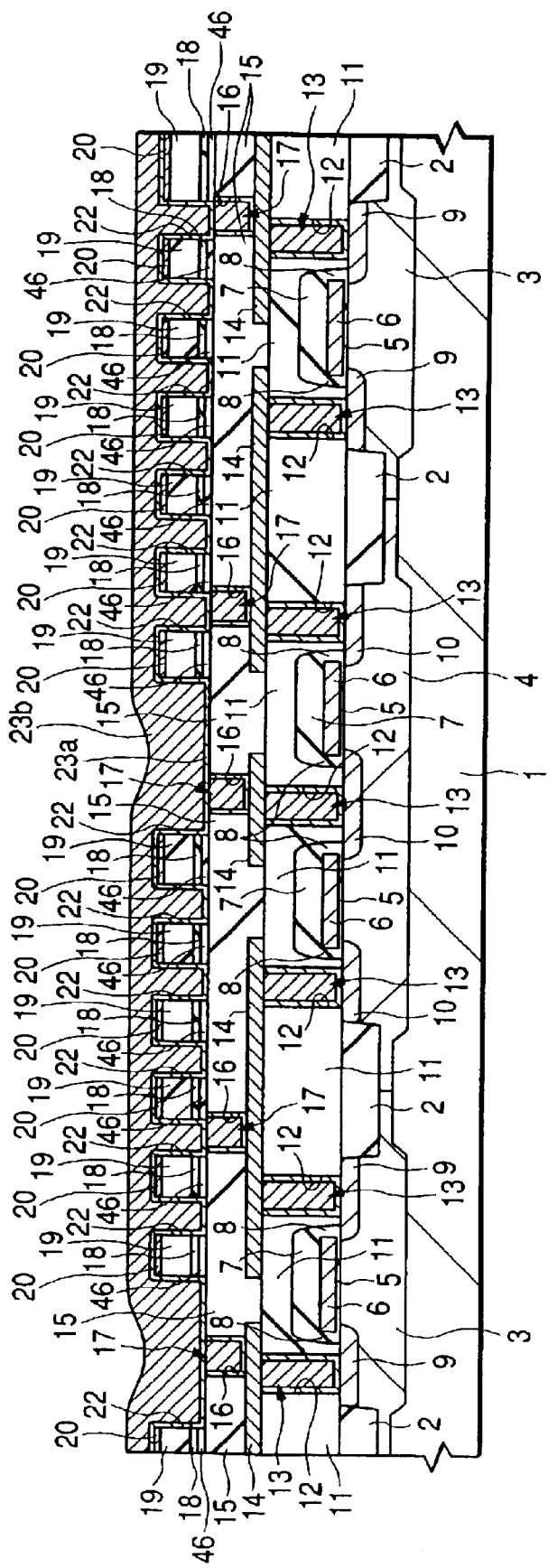
FIG. 36 is a fragmentary cross-sectional view of a semiconductor substrate for illustrating, in the order of the steps, one example of the manufacturing method of a semiconductor device according to Embodiment 3 of the present invention.

In a similar manner to the step as illustrated in FIG. 10 of Embodiment 1, an interconnection 23 of the second metallization layer is formed inside of the interconnection groove 22. FIG. 35 illustrates a barrier metal layer 23a, seed layer (not illustrated) and copper-plated layer 23b formed in the interconnection groove 22 which has been made by removing the stopper insulating film 18 and the adhesion layer 46 using the first method described with reference to FIG. 33. FIG. 36 illustrates the barrier metal layer 23a, seed layer (not illustrated) and copper-plated layer 23b formed in the interconnection groove 22, which has been made by removing the stopper insulating film 18 using the second method described with reference to FIG. 34.

Figure 37:
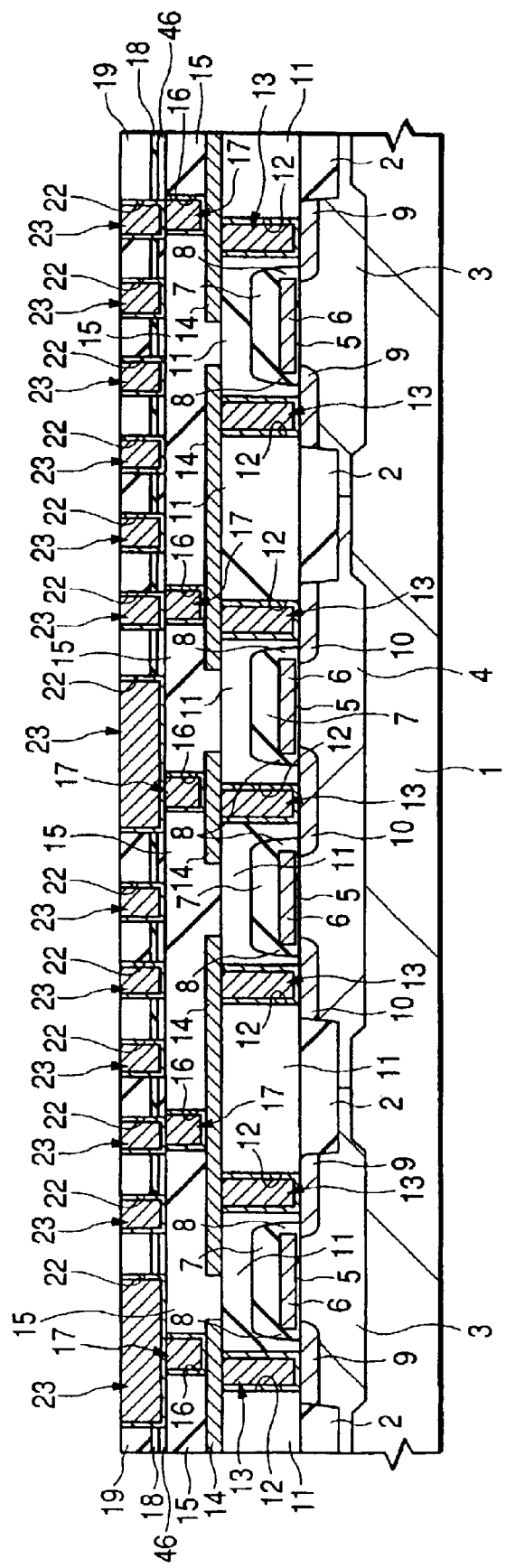
FIG. 37 is a fragmentary cross-sectional view of a semiconductor substrate for illustrating, in the order of the steps, one example of the manufacturing method of a semiconductor device according to Embodiment 3 of the present invention.

As illustrated in FIG. 37, the plated layer 23b and seed layer are polished by CMP. Polishing is continued further to remove even the barrier metal layer 23a over the insulating film 19, whereby the barrier metal layer 23a and copper films (plated layer 23 and seed layer) are removed from a region outside the interconnection groove 22.

Upon removal of the stopper insulating film 18 by the first method, as illustrated above in FIG. 33, removal by CMP is continued until completion of the removal of the barrier metal 23a on the insulating film 19. Upon removal of the stopper insulating film 18 by the second method, as illustrated in FIG. 34, on the other hand, removal by CMP is continued until the removal of both the barrier metal layer 23a on the insulating film 19 and the hard mask 20 is completed.

In the above-described manner, the interconnection 23 of the second metallization layer according to Embodiment 3 is completed.

According to Embodiment 3, a deterioration in the quality of the organic SOG film can be suppressed, because the organic SOG film constituting the stopper insulating film 18 is free from the influence of oxygen plasma, as described above in Embodiment 1. Another advantage brought about by this Embodiment is that an increase in the capacitance between interconnections can be suppressed by using, as the stopper insulating film 18, an organic SOG film having a low dielectric constant. In addition to these advantages, delamination of the stopper insulating film 18 due to the influence of degassing can be prevented even if degassing occurs upon formation of the stopper insulating film 18 or insulating film 19, by positively causing de gassing from the gap of the plug 17 by hydrogen annealing after formation of the plug 17 or by disposal of the adhesion layer 46 over the plug 17.

(Embodiment 4)

FIGS. 38 to 46 are fragmentary cross-sectional views each illustrating, in the order of steps, a method of manufacture of the semiconductor device according to Embodiment 4 of the present invention. In FIGS. 38 to 46, only a second metallization layer is illustrated.

Figure 38:
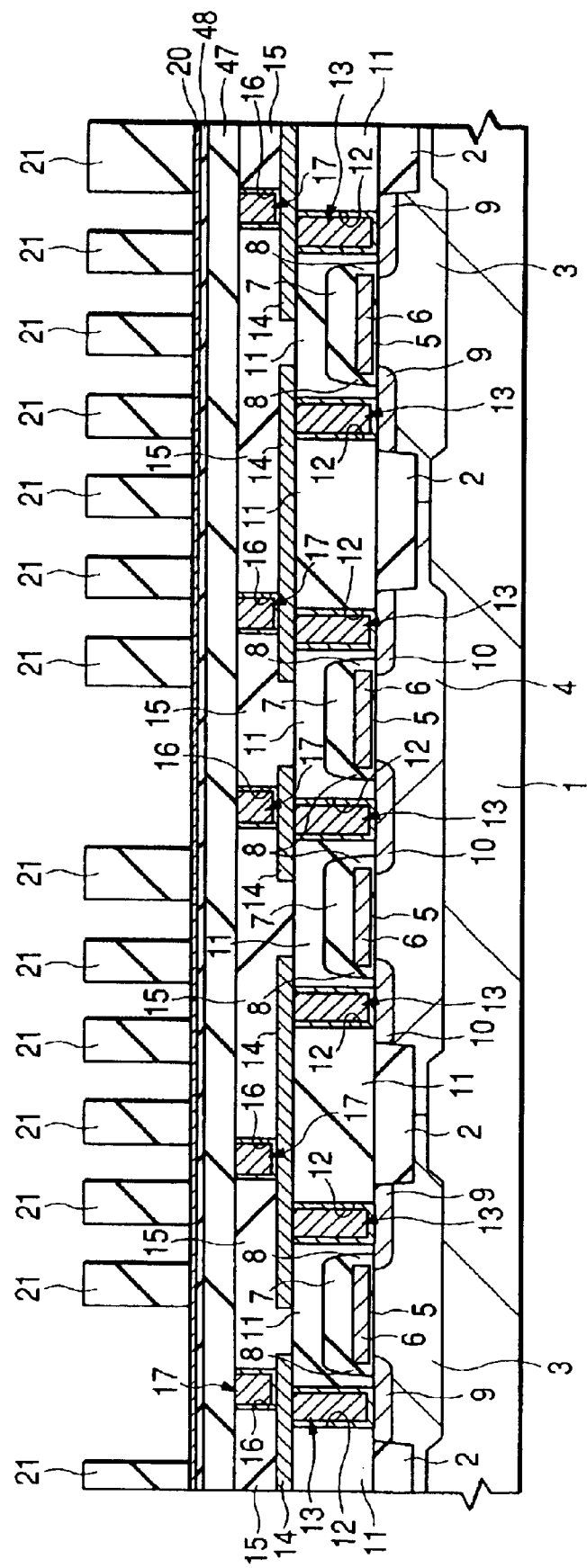
FIG. 38 is a fragmentary cross-sectional view of a semiconductor substrate for illustrating, in the order of the steps, one example of the manufacturing method of a semiconductor device according to a still further embodiment (Embodiment 4) of the present invention.

In the manufacturing method of this Embodiment 4, after the steps similar to those of Embodiment 1, as illustrated in FIG. 3, a first insulating film 47, a second insulating film 48 and a hard mask 20 are successively formed over the plug 16, as illustrated in FIG. 38. The first insulating film 47 is made of, for example, an organic SOG film, and it has, for example, a thickness of about 200 to 3000 nm. The invention is not limited to use of an organic SOG film but an organic low-dielectric-constant film having a high etching selectivity relative to the second insulating film 48 and a lower dielectric constant than a silicon oxide film is also usable. The second insulating film 48 is, for example, made of a TEOS oxide film, and its thickness is, for example, about 100 to 500 nm. The invention is not limited to use of a TEOS oxide film, but an insulating film having a lower dielectric constant than a silicon nitride film is also usable. The first insulating film 47 is formed to be thicker than the second insulating film.

The first insulating film 47, serving as an etching stopper of the second insulating film 48, is formed to have a thickness required for an etching stopper, and, at the same time, is formed to be thick in consideration of a reduction in the capacitance between interconnections. The above-described thickness of 200 to 3000 nm is determined in consideration of such conditions.

A resist film 21 is then formed over the hard mask 20 by photolithography. The resist film 21 is patterned into an interconnection groove pattern so that an opening is formed in a region wherein an interconnection groove is to be formed.

Figure 39:
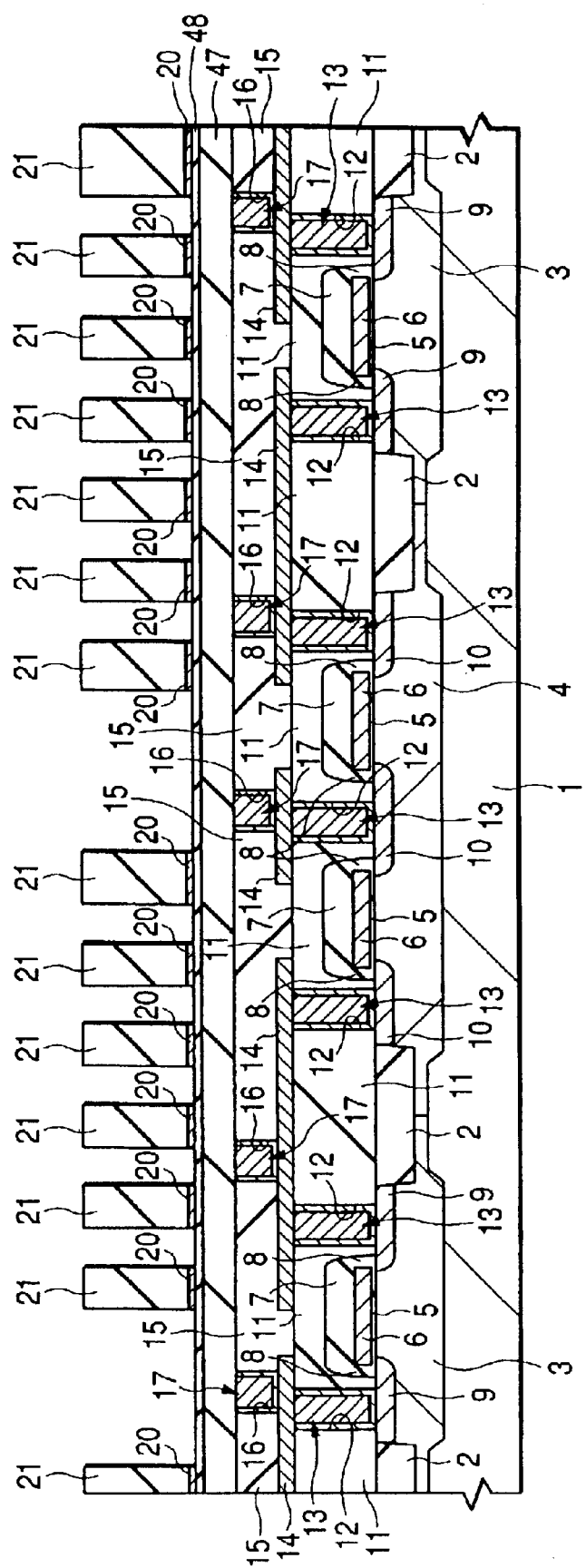
FIG. 39 is a fragmentary cross-sectional view of a semiconductor substrate for illustrating, in the order of the steps, one example of the manufacturing method of a semiconductor device according to Embodiment 4 of the present invention.
Figure 40:
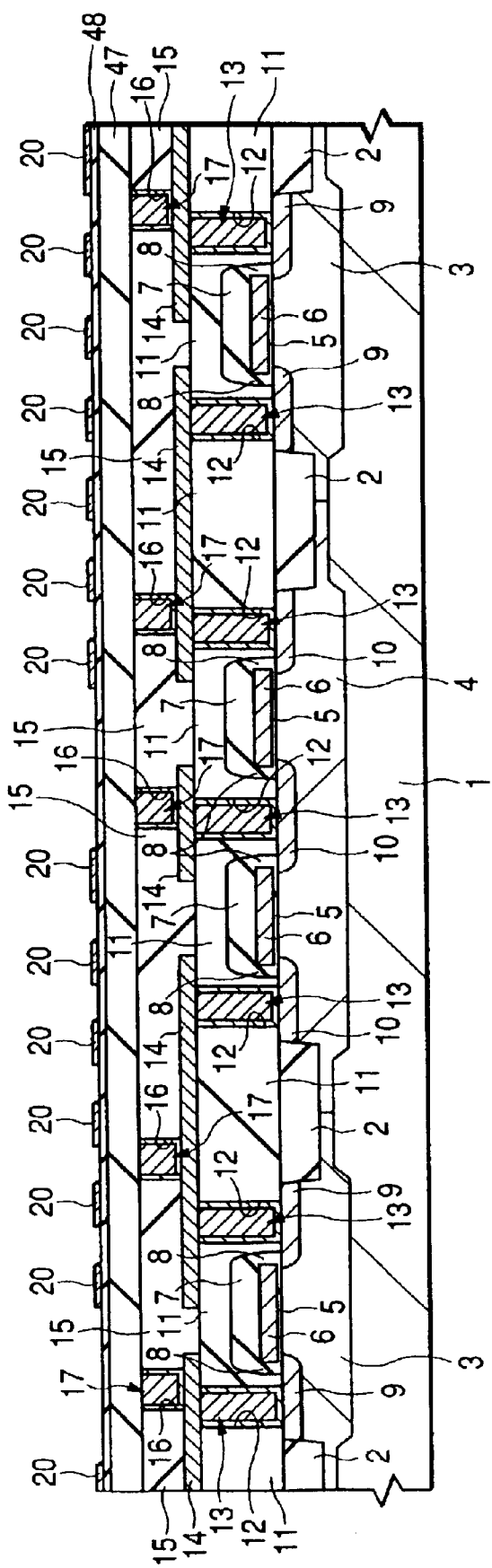
FIG. 40 is a fragmentary cross-sectional view of a semiconductor substrate for illustrating, in the order of the steps, one example of the manufacturing method of a semiconductor device according to Embodiment 4 of the present invention.

As illustrated in FIG. 39, the hard mask 20 is dry etched in the presence of the resist film 21 to transfer the interconnection groove pattern to the hard mask 20. As illustrated in FIG. 40, the resist film 21 is then removed by ashing with oxygen plasma. In this manner, the hard mask 20 having the interconnection groove pattern transferred thereto is formed. At this time, the organic SOG film constituting the first insulating film 47 has been covered with the second insulating film 48 having high resistance to oxygen plasma so that the organic SOG film is not exposed to oxygen plasma. Such a structure makes it possible to prevent a deterioration of the organic SOG film due to oxygen plasma.

Figure 41:
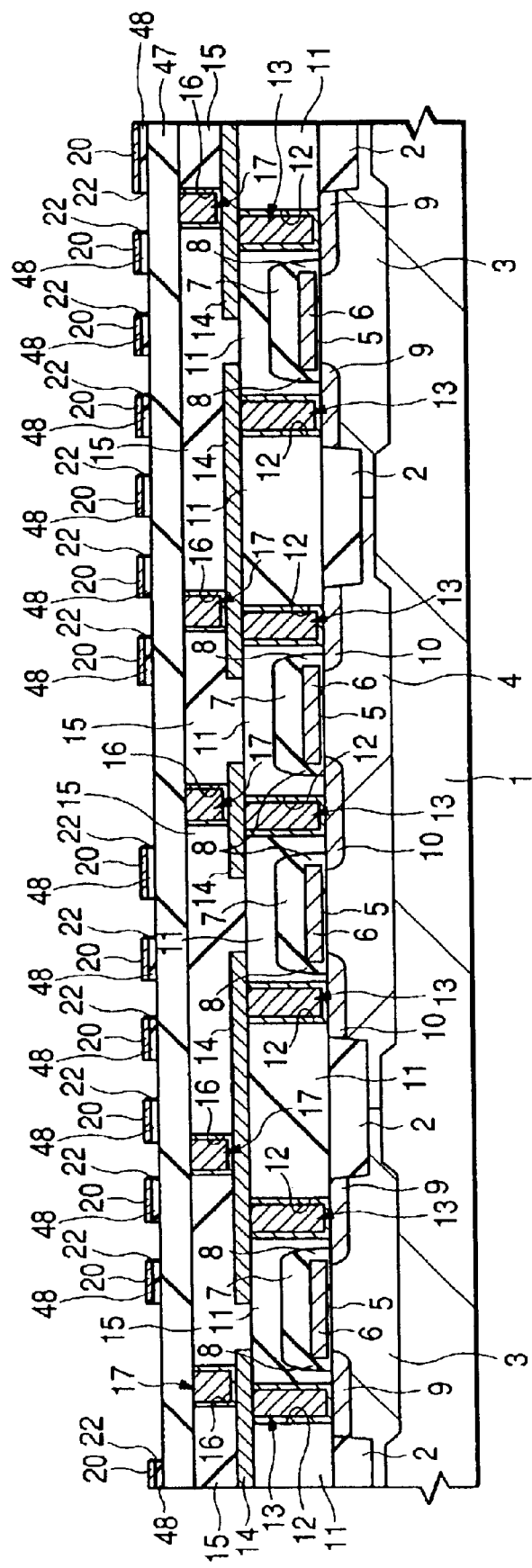
FIG. 41 is a fragmentary cross-sectional view of a semiconductor substrate for illustrating, in the order of the steps, one example of the manufacturing method of a semiconductor device according to Embodiment 4 of the present invention.
Figure 42:
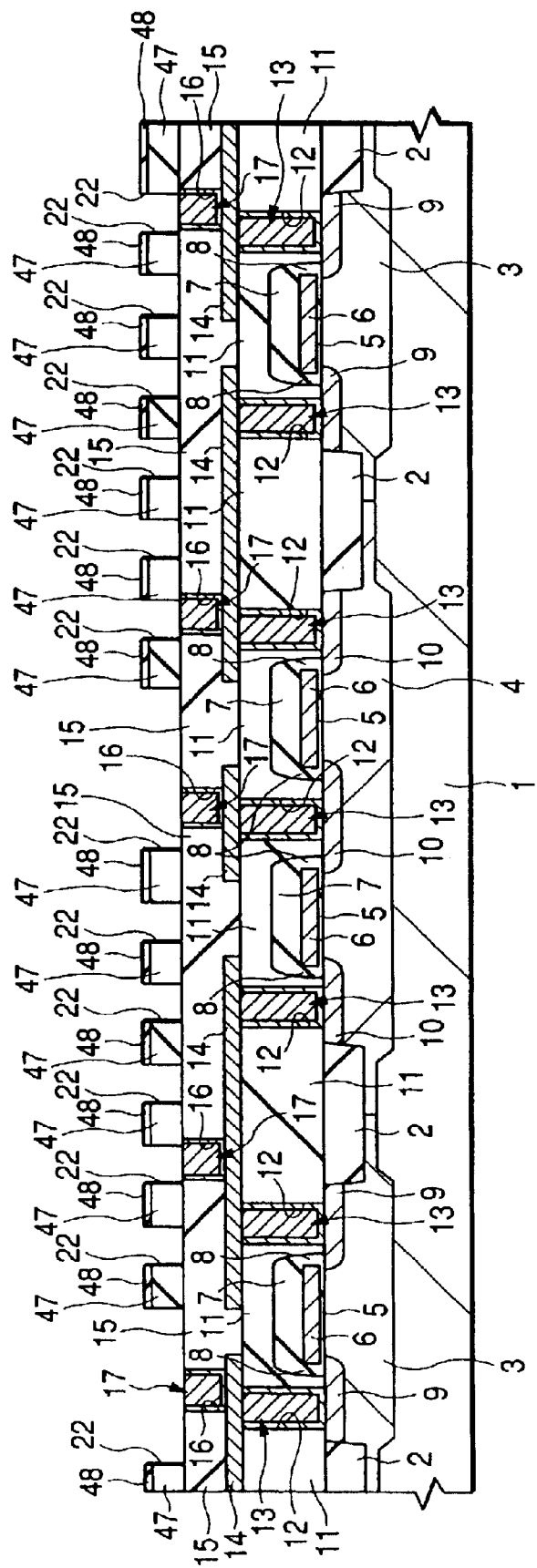
FIG. 42 is a fragmentary cross-sectional view of a semiconductor substrate for illustrating, in the order of the steps, one example of the manufacturing method of a semiconductor device according to Embodiment 4 of the present invention.

As illustrated in FIG. 41, using the patterned hard mask 20 as a mask and the first insulating film 47 as an etching stopper, first etching is conducted. By this first etching, a portion of the interconnection groove 22 is formed in the second insulating film 48. The first etching is conducted under conditions permitting easy etching of the second insulating film 48 (TEOS oxide film) and not permitting easy etching of the hard mask 20 and the first insulating film 47 (organic SOG film).

Using the hard mask 20 as a mask, second etching is then conducted. By this second etching, an exposed portion of the first insulating film 47 is removed to form another portion of the interconnection groove 22 in the first insulating film 47. This etching can be conducted by either one of the following two methods.

The first method is to select a condition under which the etching selectivity of the hard mask 20 is lower than that to the first insulating film 47 (organic SOG film). By this etching, the hard mask 20 and the first insulating film 47 are etched at a substantially similar rate.

Figure 43:
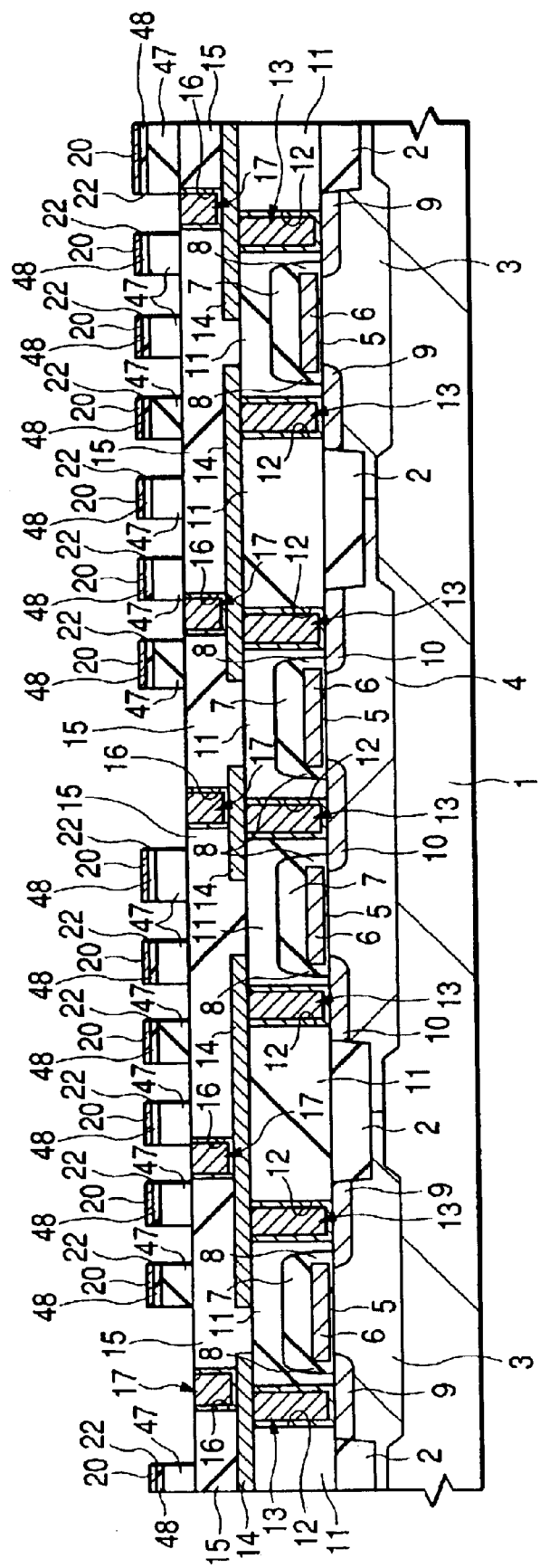
FIG. 43 is a fragmentary cross-sectional view of a semiconductor substrate for illustrating, in the order of the steps, one example of the manufacturing method of a semiconductor device according to Embodiment 4 of the present invention.

The second method is to select a condition under which the etching selectivity to the hard mask 20 is higher than that to the first insulating film 47 (organic SOG film) as illustrated in FIG. 43. By this etching, the first insulating film 47 is etched, but the hard mask 20 is not etched easily.

Figure 44:
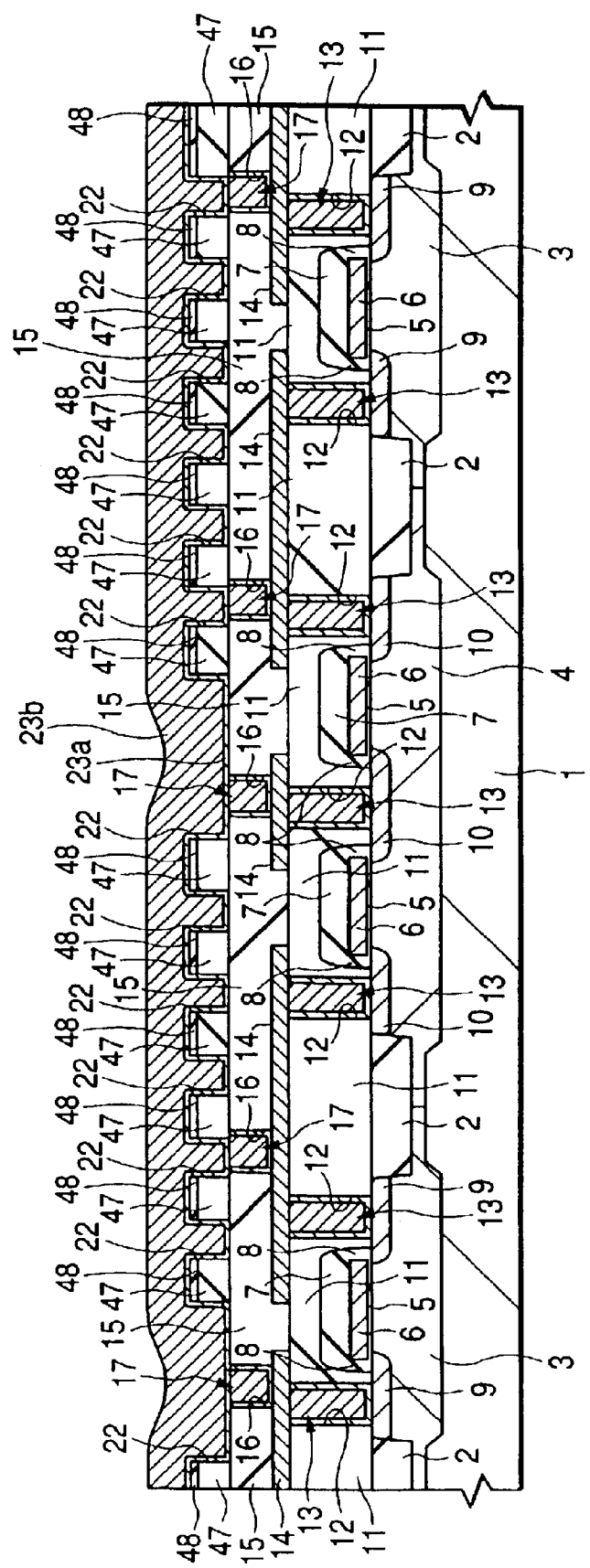
FIG. 44 is a fragmentary cross-sectional view of a semiconductor substrate for illustrating, in the order of the steps, one example of the manufacturing method of a semiconductor device according to Embodiment 4 of the present invention.
Figure 45:
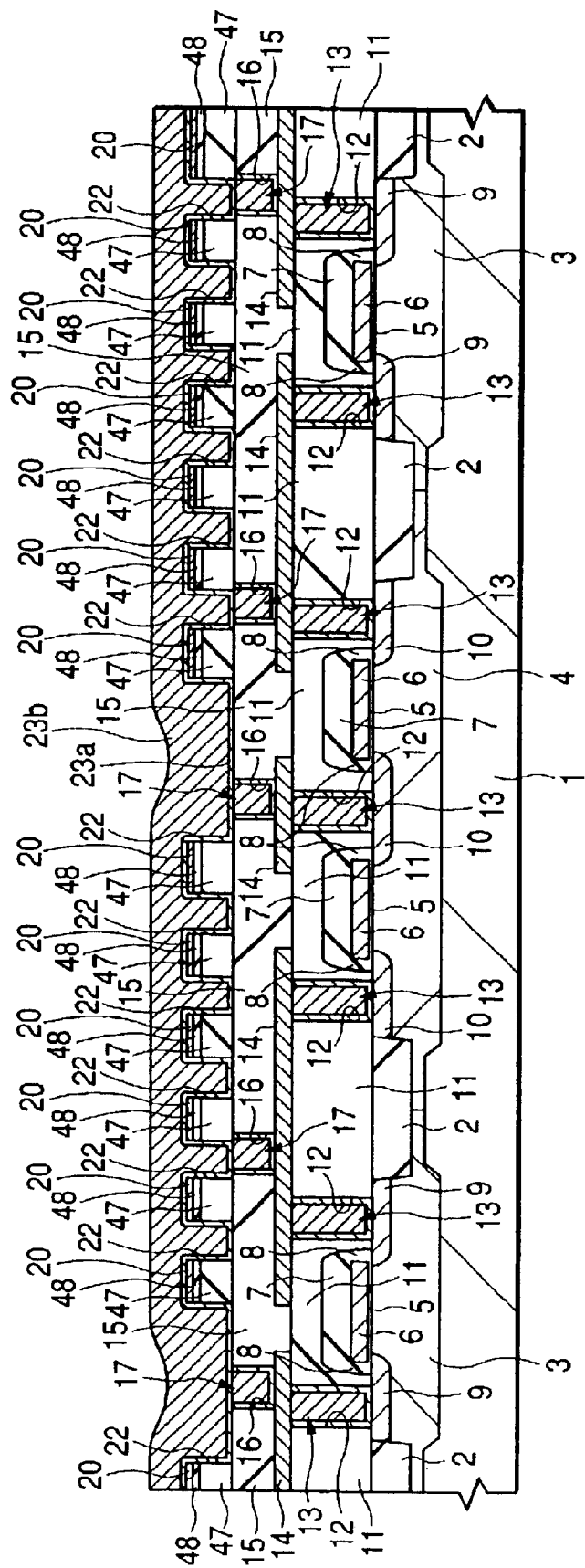
FIG. 45 is a fragmentary cross-sectional view of a semiconductor substrate for illustrating, in the order of the steps, one example of the manufacturing method of a semiconductor device according to Embodiment 4 of the present invention.

In a similar manner to the step as illustrated in FIG. 10 of Embodiment 1, an interconnection 23 of the second metallization layer is formed inside of the interconnection groove 22. FIG. 44 illustrates the barrier metal layer 23a, seed layer (not illustrated) and copper-plated layer 23b formed in the interconnection groove 22, which has been made by removing the first insulating film 47 using the first method described with reference to FIG. 42. FIG. 45 illustrates the barrier metal layer 23a, seed layer (not illustrated) and copper-plated layer 23b formed in the interconnection groove 22 which has been made by removing the first insulating film 47 using the second method described with reference to FIG. 43.

Figure 46:
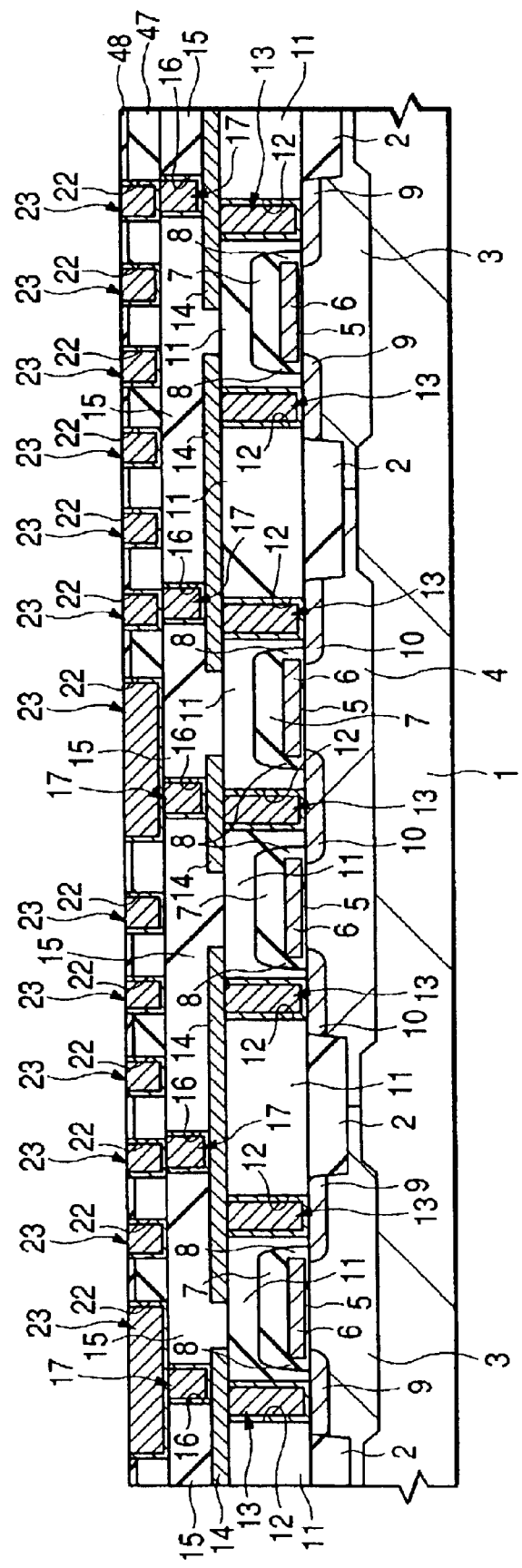
FIG. 46 is a fragmentary cross-sectional view of a semiconductor substrate for illustrating, in the order of the steps, one example of the manufacturing method of a semiconductor device according to Embodiment 4 of the present invention.

As illustrated in FIG. 46, the plated layer 23b and seed layer are polished by CMP. Polishing is continued further to remove even the barrier metal layer 23a over the second insulating film 48, whereby the barrier metal layer 23a and copper films (plated layer 23 and seed layer) are removed from a region outside the interconnection groove 22.

Upon removal of the first insulating film 47 using the first method as illustrated above in FIG. 42, removal by CMP is continued until completion of the removal of the barrier metal 23a on the second insulating film 48. Upon removal of the first insulating film 47 using the second method as illustrated in FIG. 43, on the other hand, removal by CMP is continued until removal of both the barrier metal 23a on the second insulating film 48 and the hard mask 20 is completed.

In the above-described manner, the interconnection 23 of the second metallization layer according to Embodiment 4 is completed.

According to this Embodiment 4, deterioration in the quality of the organic SOG film can be suppressed, because the organic SOG film constituting the first insulating film 47 is free from the influence of the oxygen plasma, as described above in Embodiment 1. Another advantage of this Embodiment 4 is that an increase in the capacitance between interconnections can be suppressed by using, as the first insulating film 47, an organic SOG film having a low dielectric constant. In particular, an increase in the capacitance between interconnections can be suppressed highly by increasing the etching selectivity to the hard mask 20 relative to the first insulating film 47, thereby making it possible to thicken the first insulating film 47.

Various aspects and features of the present invention have so far been described specifically based on the above-described embodiments of the present invention. It should however be borne in mind that the present invention is not limited to or by them. It is needless to say that the present invention can be changed within an extent not departing from the scope of the present invention.

For example, in the above-described embodiments, the plug to be connected with the metallization layer is made of a tungsten film, but a copper film is usable as well. The plug made of a copper film can be formed in the following manner. A barrier metal layer having a function of preventing diffusion of copper is formed all over the surface of the semiconductor substrate, including the inside of the connecting hole, followed by formation of a copper film to be embedded the connecting hole therewith. The copper film and barrier metal layer are removed by CMP from a region other than the connecting hole, whereby a plug is formed.

The copper film can be formed, for example, by plating. Prior to the formation of the plated layer, a thin copper film can be formed as a seed layer by sputtering. Alternatively, the copper film may be formed by sputtering. In this case, it is possible to improve the embedding properties of the copper film in the connecting hole by forming it by sputtering and fluidizing the resulting copper film by heat treatment.

In the above-described embodiments, the present invention is applied to the steps of forming a metallization layer, but it can also be applied to the steps of forming a plug for connecting between the upper and lower metallization layers. Similar advantages are available in this case.

In the above-described embodiments, the present invention is applied to a desired plural number of metallization layers constituting a multilevel metallization, but it may be applied to a metallization layer to be connected with a semiconductor region or electrode formed over the main surface of the semiconductor substrate. Similar advantages are available also in this case.

Advantages available by typical aspects of the invention, among those disclosed in the present application, will next be described simply.

The present invention makes it possible to prevent deterioration in the quality of an insulating film disposed between the upper and lower metallization layers. Moreover, adhesion between the metallization layer and the plug disposed there below can be improved. By these advantages, the damascene interconnection acquires an improved reliability.

The present invention makes it possible to reduce the capacitance between interconnections by constituting the insulating film, which surrounds the metallization layer, with an insulating material having a relatively low dielectric constant, thereby bringing about an improvement in the performance of the semiconductor device.

What is claimed is:

1. A method of manufacturing a semiconductor device, comprising the steps of:
   (a) forming an opening in an interlayer insulating film formed over a substrate;
   (b) burying a barrier metal layer and a conductive film in said opening such that barrier metal layer is formed, within said opening, between said interlayer insulating film and said conductive film;
   (c) depositing a first insulating film over said interlayer insulating film, a second insulating film over said first insulating film, a third insulating film over said second insulating film and a hard mask over said third insulating film;
   (d) patterning said hard mask for forming a pattern of said hard mask by using a resist mask as a mask;
   (e) after said step (d), removing said resist mask;
   (f) etching said third insulating film by using said hard mask as a mask, for transferring said pattern of said hard mask to said third insulating film; and
   (g) etching said second insulating film by using said hard mask as a mask, for transferring the pattern of the hard mask to said second insulating film;
   wherein said second insulating film is an organic-functional-group containing insulating film having a low dielectric constant than a silicon oxide film, and
   wherein said third insulating film has a lower dielectric constant than a silicon nitride film.

2. The method of manufacturing a semiconductor device according to claim 1, further comprising the step of;

(h) between said step (a) and said step (b) performing hydrogen annealing to said conductive film.

3. The method of manufacturing a semiconductor device according to claim 1, wherein in said step (d), said third insulating layer is etched in a half-away such that said pattern does not reach said second insulating film.

4. A method of manufacturing a semiconductor device, comprising the steps of:

(a) forming an opening in an interlayer insulating film formed over a substrate;

(b) burying a barrier metal layer and a conductive film in said opening such that said barrier metal layer is formed, within said opening, between said interlayer insulating film and said conductive film;

(c) depositing a first insulating film over said interlayer insulating film, a second insulating film over said first insulating film; a third insulating film over said second insulating film and a hard mask over said third insulating film;

(d) patterning said hard mask for forming a pattern of said hard mask by using a resist mask as a mask;

(e) after said step (d), removing said resist mask;

(f) etching said third insulating film by using said hard mask as a mask, for transferring said pattern of said hard mask to said third insulating film; and (g) etching said second insulating film by using said hard mask as a mask, for transferring the pattern of the hard mask to said second insulating film, wherein said second insulating film is an organic-functional-group containing insulating film having a low dielectric constant than a silicon oxide film, wherein said third insulating film has a resistance to the oxygen plasma greater than said second insulating, wherein said hard mask has an etching late lower than said third insulating film in said step (f).

5. The method of manufacturing a semiconductor device according to claim 4, further comprising the step of:

(h) between said step (a) and said step (b) performing hydrogen annealing to said conductive film.

6. The method of manufacturing a semiconductor device according to claim 4, wherein in said step (d), said third insulating layer is etched a half-away such that said pattern does not reach said second insulating film.

7. A method of manufacturing a semiconductor device, comprising steps of:

(a) forming an opening in an interlayer insulating film formed over a substrate;

(b) burying a barrier metal layer and a conductive film in said opening such that said barrier metal layer is formed, within said opening, between said interlayer insulating film and said conductive film;

(c) depositing an adhesion layer over said interlayer insulating film, a first insulating film over said adhesion layer, and a second insulating film over said first insulating film;

(d) selectively forming a hard mask over said second insulating film;

(e) etching said second insulating film by using said hard mask as a mask for transferring a pattern of said hard mask to said second insulating film; and (f) etching said first insulating film by using said hard mask as a mask for transferring the pattern of the hard mask to said first insulating film, wherein said first insulating film is an organic-functional-group-containing insulating film having a lower dielectric constant than a silicon oxide film, and wherein said second insulating film is comprised of substantially the same material as said adhesion layer.

8. The method of manufacturing a semiconductor device according to claim 7, further comprising the step of:

(g) between said step (b) and said step (c), performing hydrogen annealing to said conductive film.

9. The method of manufacturing a semiconductor device according to claim 7, wherein said adhesion layer is comprised of a silicon oxide film and wherein said second insulating film is comprised of a silicon oxide film.

10. The method of manufacturing a semiconductor device according to claim 7, wherein said second insulating film has a resistance to oxygen plasma greater than that of said first insulating film and wherein said hard mask has an etching late lower than that of sad second insulating film in said step (f).

11. The method of manufacturing a semiconductor device according to claim 7, wherein said adhesion layer has a thickness equal to or less than 50 nm.

12. The method of manufacturing a semiconductor device according to claim 1, wherein said first insulating film is comprised of a silicon oxide film, and wherein said third insulating film is comprised of a silicon oxide film.

13. The method of manufacturing a semiconductor device according to claim 4, wherein said first insulating film is comprised of a silicon oxide film, and wherein said third insulating film is comprised of a silicon oxide film.

* * * * *